United States Patent
Oniki et al.

(10) Patent No.: US 8,243,449 B2
(45) Date of Patent: Aug. 14, 2012

(54) HEAT-TRANSPORTING DEVICE AND ELECTRONIC APPARATUS

(75) Inventors: Kazunao Oniki, Tokyo (JP); Takashi Yajima, Tokyo (JP)

(73) Assignee: Sony Corporation, Tokyo (JP)

(*) Notice: Subject to any disclaimer, the term of this patent is extended or adjusted under 35 U.S.C. 154(b) by 208 days.

(21) Appl. No.: 12/635,125

(22) Filed: Dec. 10, 2009

(65) Prior Publication Data

US 2010/0157534 A1 Jun. 24, 2010

(30) Foreign Application Priority Data

Dec. 24, 2008 (JP) ................... 2008-328872

(51) Int. Cl.
*H05K 7/20* (2006.01)
*F28F 7/00* (2006.01)
*H01L 23/34* (2006.01)

(52) U.S. Cl. . 361/700; 165/80.4; 165/80.5; 165/104.33; 165/104.21; 165/104.26; 257/714; 257/E23.088; 174/15.2

(58) Field of Classification Search ............. 361/679.47, 361/679.52, 700; 165/80.4–80.5, 104.33, 165/104.21, 104.26; 257/714–715, E23.088; 174/15.1–15.2, 252
See application file for complete search history.

(56) References Cited

U.S. PATENT DOCUMENTS

| | | | |
|---|---|---|---|
| 2001/0004934 A1* | 6/2001 | Yamamoto et al. | 165/104.11 |
| 2007/0163755 A1* | 7/2007 | Kim et al. | 165/104.26 |
| 2007/0240854 A1* | 10/2007 | Liu et al. | 165/104.26 |
| 2008/0245511 A1* | 10/2008 | Lai | 165/104.26 |

FOREIGN PATENT DOCUMENTS

| | | |
|---|---|---|
| JP | 51-151267 | 12/1976 |
| JP | 2006-140435 | 6/2006 |
| JP | 2006-292355 | 10/2006 |
| JP | 2008-082698 | 4/2008 |

OTHER PUBLICATIONS

Japanese Patent Office Action dated Nov. 2, 2010 corresponding to Japanese No. 2008-328872.

* cited by examiner

*Primary Examiner* — Zachary M Pape
(74) *Attorney, Agent, or Firm* — SNR Denton US LLP

(57) ABSTRACT

A heat-transporting device includes a working fluid, a vessel, a vapor-phase flow path, and a liquid-phase flow path. The working fluid transports heat using a phase change. The vessel seals in the working fluid. The vapor-phase flow path includes a first mesh member and causes the working fluid in a vapor phase to circulate inside the vessel, the first mesh member including a through-hole larger than a mesh thereof. The liquid-phase flow path causes the working fluid in a liquid phase to circulate inside the vessel.

11 Claims, 31 Drawing Sheets

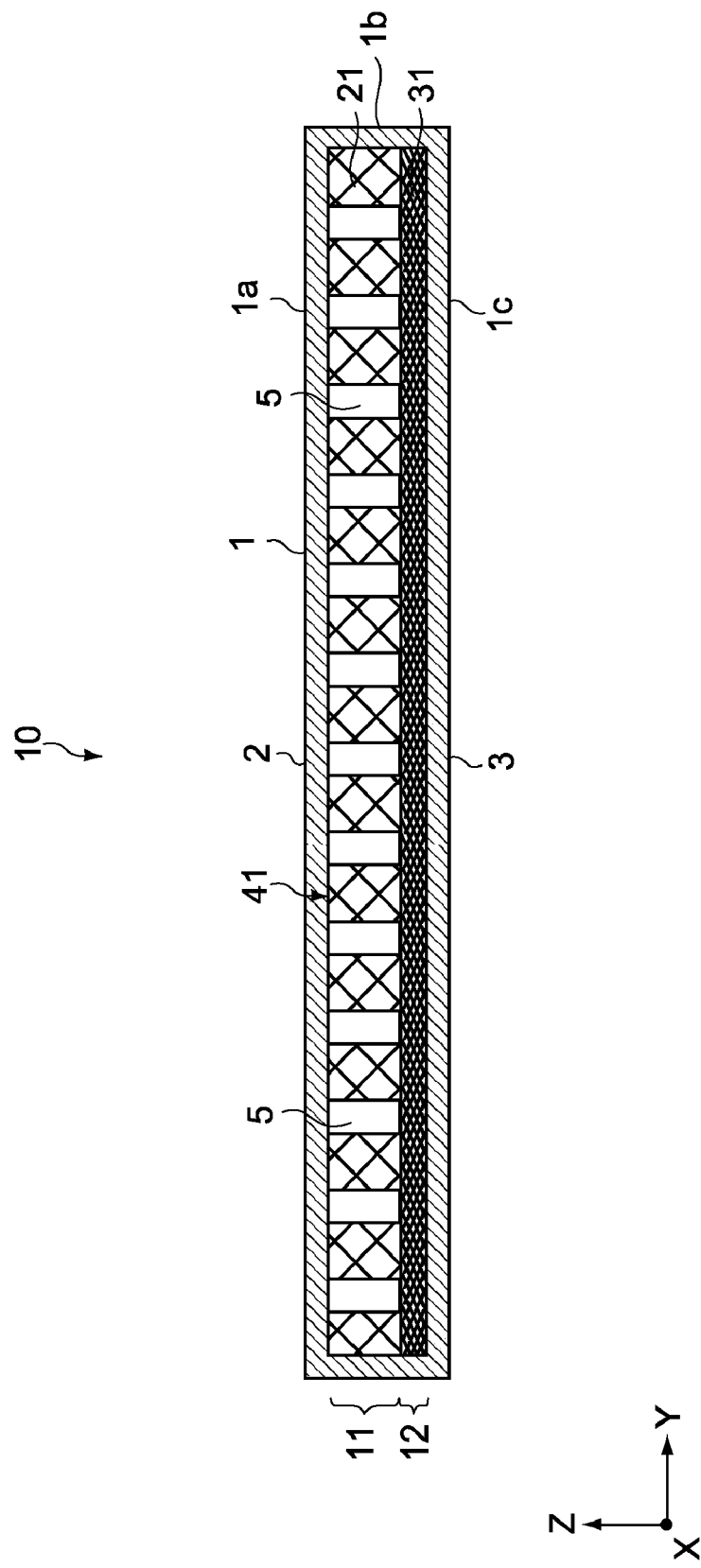

$r = (W+D)/2$ $r = ab/(a+b)$

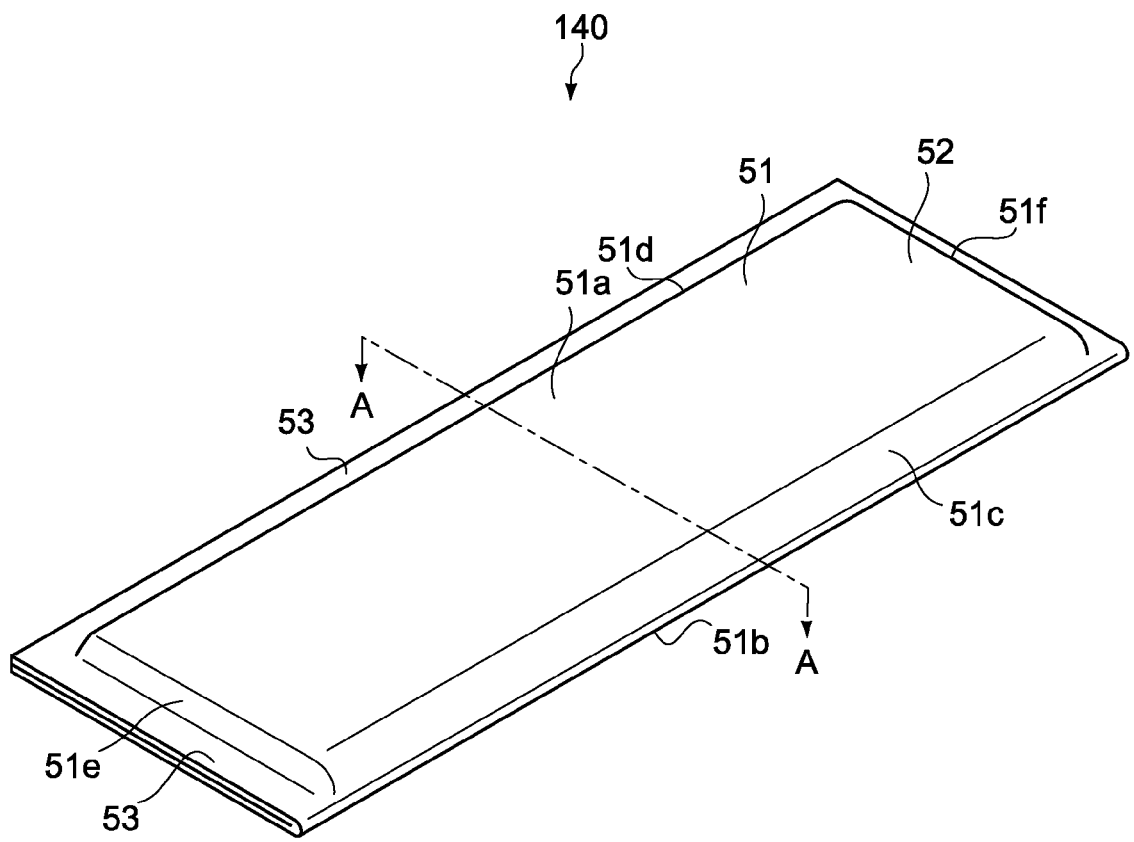
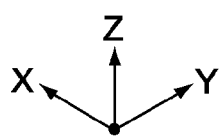
FIG.24

HEAT-TRANSPORTING DEVICE AND ELECTRONIC APPARATUS

BACKGROUND OF THE INVENTION

1. Field of the Invention

The present invention relates to a heat-transporting device for transporting heat using a phase change of a working fluid and an electronic apparatus including the heat-transporting device.

2. Description of the Related Art

From the past, a heat pipe has been widely used as a device for transporting heat from a heat source such as a CPU (Central Processing Unit) of a PC (Personal Computer). As the heat pipe, a pipy heat pipe and a planar heat pipe are widely known. In such a heat pipe, a working fluid such as water is sealed inside and circulated while changing phases inside the heat pipe, to thus transport heat from a heat source such as a CPU. A driving source for circulating a working fluid needs to be provided inside the heat pipe, and a metal sintered body, a metal mesh, and the like for generating a capillary force are generally used.

For example, Japanese Patent Application Laid-open No. 2006-292355 (paragraphs (0003), (0010), and (0011), FIGS. 1, 3, and 4) discloses a heat pipe that uses a metal sintered body or a metal mesh.

Incidentally, in such a heat pipe, there are cases where the heat pipe is deformed due to a vapor pressure of the working fluid at a time an internal temperature of the heat pipe increases. Particularly when a planar heat pipe is used, the heat pipe is often deformed at a plane portion thereof due to an internal pressure.

As a technique regarding such a problem, for example, Japanese Patent Application Laid-open No. 2006-140435 (paragraph (0013), FIGS. 2 and 3; hereinafter, referred to as Patent Document 2) discloses a heat spreader in which a deformation is suppressed by forming pillar-like members inside the heat spreader.

SUMMARY OF THE INVENTION

However, if pillar-like members are formed inside like the heat spreader disclosed in Patent Document 2, a structure becomes complex and reliability on a strength is lowered. Moreover, costs are also disadvantageous.

In this regard, there is a method of providing, instead of the pillar-like members, a mesh member in a flow path of a working fluid in a vapor phase (hereinafter, referred to as vapor-phase flow path). However, there has been a problem that, if the mesh member is disposed in the vapor-phase flow path as it is, high heat-transporting performance is difficult to be realized due to a flow-path resistance of the mesh member.

In view of the circumstances as described above, there is a need for a heat-transporting device that has high heat-transporting performance and an electronic apparatus including the heat-transporting device.

According to an embodiment of the present invention, there is provided a heat-transporting device including a working fluid, a vessel, a vapor-phase flow path, and a liquid-phase flow path.

The working fluid transports heat using a phase change.

The vessel seals in the working fluid.

The vapor-phase flow path includes a first mesh member and causes the working fluid in a vapor phase to circulate inside the vessel.

The first mesh member includes a through-hole larger than a mesh thereof.

The liquid-phase flow path causes the working fluid in a liquid phase to circulate inside the vessel.

In the embodiment of the present invention, a through-hole is formed in the first mesh member that constitutes the vapor-phase flow path. Accordingly, a flow-path resistance of the vapor-phase flow path can be reduced, with the result that heat-transporting performance of the heat-transporting device can be improved. Moreover, since the vapor-phase flow path is constituted of a mesh member, a structure is simple and reliability on a strength of the heat-transporting device can be improved. Further, costs can also be reduced.

The heat-transporting device may further include an evaporation area where the working fluid evaporates, a condensation area where the working fluid is condensed, and a flow-path area through which the working fluid circulates.

In this case, the first mesh member may include a first through-hole having a first area and a second through-hole having a second area different from the first area.

The first through-hole is provided in the flow-path area.

The second through-hole is provided in at least one of the evaporation area and the condensation area.

In the embodiment of the present invention, the area of the first through-hole provided in the flow-path area and the area of the second through-hole provided in the evaporation area and/or the condensation area differ. By thus differentiating the areas of the through-holes depending on the area, the heat-transporting performance of the heat-transporting device can be improved efficiently.

In the heat-transporting device, the first area may be larger than the second area. Alternatively, the first area may be smaller than the second area.

With this structure, the heat-transporting performance of the heat-transporting device can be improved efficiently.

When the heat-transporting device further includes the evaporation area, the condensation area, and the flow-path area, the through-hole of the first mesh member may be provided in the flow-path area. Alternatively, the through-hole of the first mesh member may be provided in at least one of the evaporation area and the condensation area.

With this structure, the heat-transporting performance of the heat-transporting device can be improved efficiently.

In the heat-transporting device, the liquid-phase flow path may include a second mesh member including a through-hole larger than a mesh thereof.

In the embodiment of the present invention, a through-hole is also provided in the second mesh member that constitutes the liquid-phase flow path. Accordingly, a flow-path resistance of the liquid-phase flow path can be reduced, with the result that the heat-transporting performance can be improved.

When the heat-transporting device further includes the evaporation area, the condensation area, and the flow-path area, the second mesh member may include a first through-hole having a first area and a second through-hole having a second area different from the first area.

The first through-hole is provided in the flow-path area.

The second through-hole is provided in at least one of the evaporation area and the condensation area.

By thus differentiating the areas of the through-holes depending on the area, the heat-transporting performance of the heat-transporting device can be improved efficiently.

In the heat-transporting device, the first area may be larger than the second area. Alternatively, the first area may be smaller than the second area.

With this structure, the heat-transporting performance of the heat-transporting device can be improved efficiently.

When the heat-transporting device further includes the evaporation area, the condensation area, and the flow-path area, the through-hole of the second mesh member may be provided in the flow-path area. Alternatively, the through-hole of the second mesh member may be provided in at least one of the evaporation area and the condensation area.

With this structure, the heat-transporting performance of the heat-transporting device can be improved efficiently.

In the heat-transporting device, the through-hole of the first mesh member may be formed at a position different from that of the through-hole of the second mesh member.

With this structure, the heat-transporting performance of the heat-transporting device can be improved efficiently.

In the heat-transporting device, the vessel may be plate-like.

In the heat-transporting device, the vessel may be formed by bending a plate member so that the first mesh member is sandwiched by the bent plate member.

With this structure, since the vessel can be formed of a single plate member, costs can be reduced.

In the heat-transporting device, the plate member may include an opening in an area where the plate member is bent.

With this structure, since the plate member can be easily bent, the heat-transporting device can be produced with ease.

According to an embodiment of the present invention, there is provided an electronic apparatus including a heat source and a heat-transporting device.

The heat-transporting device includes a working fluid, a vessel, a vapor-phase flow path, and a liquid-phase flow path.

The working fluid transports heat of the heat source using a phase change.

The vessel seals in the working fluid.

The vapor-phase flow path includes a first mesh member and causes the working fluid in a vapor phase to circulate inside the vessel, the first mesh member including a through-hole larger than a mesh thereof.

The liquid-phase flow path causes the working fluid in a liquid phase to circulate inside the vessel.

As described above, according to the embodiments of the present invention, a heat-transporting device that has high heat-transporting performance and an electronic apparatus including the heat-transporting device can be provided.

These and other objects, features and advantages of the present invention will become more apparent in light of the following detailed description of best mode embodiments thereof, as illustrated in the accompanying drawings.

BRIEF DESCRIPTION OF DRAWINGS

FIG. 2 is a cross-sectional side view of the heat-transporting device taken along the line A-A of FIG. 1;

FIG. 24 is a perspective view of a heat-transporting device according to another embodiment of the present invention;

DESCRIPTION OF PREFERRED EMBODIMENTS

Hereinafter, embodiments of the present invention will be described with reference to the drawings.

First Embodiment

Figure 1:
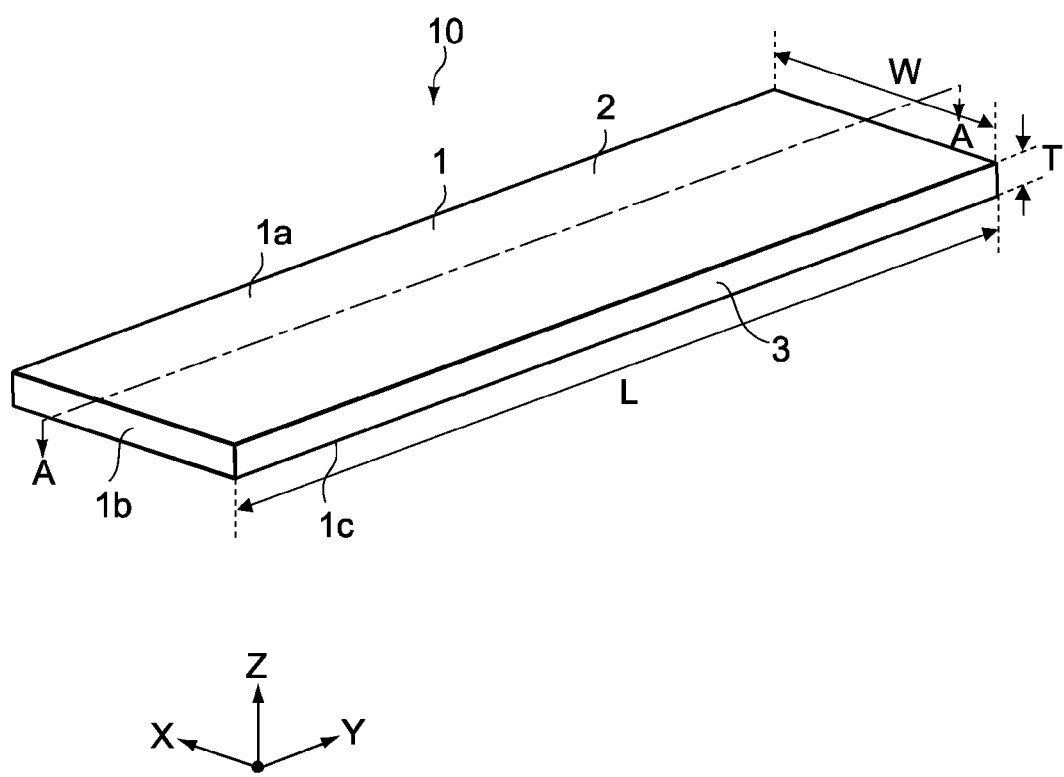
FIG. 1 is a perspective view of a heat-transporting device according to an embodiment of the present invention.

FIG. 1 is a perspective view of a heat-transporting device according to a first embodiment. FIG. 2 is a cross-sectional side view of the heat-transporting device taken along the line A-A of FIG. 1. It should be noted that in the specification, for brevity of descriptions on the figures, a heat-transporting device, components of the heat-transporting device, and the like may be illustrated in sizes different from actual sizes thereof.

As shown in the figures, a heat-transporting device 10 includes a thin rectangular plate-like vessel 1 that is elongated in one direction (y-axis direction). The vessel 1 is formed by bonding an upper plate member 2 that constitutes an upper portion 1a of the vessel 1 and a lower plate member 3 that constitutes a circumferential side portion 1b and a lower portion 1c of the vessel 1, for example. A concave portion is formed in the lower plate member 3, and the concave portion forms a space inside the vessel 1.

Typically, the upper plate member 2 and the lower plate member 3 are made of oxygen-free copper, tough pitch copper, or a copper alloy. However, the materials are not limited thereto, and the upper plate member 2 and the lower plate member 3 may be made of metal other than copper, or other materials having high heat conductivity may be used instead.

As a method of bonding the upper plate member 2 and the lower plate member 3, there are a diffusion bonding method, an ultrasonic bonding method, a brazing method, a welding method, and the like.

A length L of the vessel 1 (y-axis direction) is, for example, 10 mm to 500 mm, and a width W of the vessel 1 (x-axis direction) is, for example, 5 mm to 300 mm. Moreover, a thickness T of the vessel 1 (z-axis direction) is, for example, 0.3 mm to 5 mm. The length L, width W, and thickness T of the vessel 1 are not limited to those values and may of course take other values.

An inlet (not shown) that has a diameter of about 0.1 mm to 1 mm, for example, is provided in the vessel 1, and a working fluid is injected into the vessel 1 through this inlet. The working fluid is typically injected in a state where the vessel 1 is pressure-reduced inside.

Examples of the working fluid include pure water, alcohol such as ethanol, fluorine-based liquid such as Fluorinert FC72, and a mixture of pure water and alcohol.

As shown in FIG. 2, a laminated body 41 is disposed inside the vessel 1 of the heat-transporting device 10. The laminated body 41 is formed by laminating two mesh members 21 and 31. In descriptions below, the mesh member 21 as an upper layer out of the two laminated mesh members 21 and 31 will be referred to as vapor-phase mesh member 21, whereas the mesh member 31 as a lower layer out of those two members will be referred to as liquid-phase mesh member 31.

The vapor-phase mesh member 21 and the liquid-phase mesh member 31 are each made of, for example, copper, phosphor bronze, aluminum, silver, stainless steel, molybdenum, or an alloy thereof.

The vapor-phase mesh member 21 and the liquid-phase mesh member 31 are typically formed by cutting out a mesh member having a large area into arbitrary sizes.

The vapor-phase mesh member 21 constitutes a vapor-phase flow path 11 that causes a vapor-phase working fluid to circulate, and the liquid-phase mesh member 31 constitutes a liquid-phase flow path 12 that causes a liquid-phase working fluid to circulate.

Figure 3A:
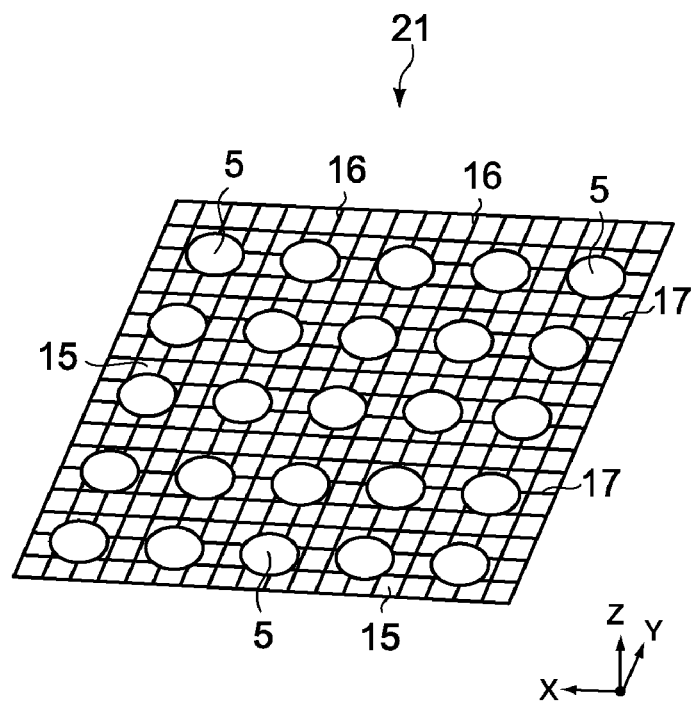
FIG. 3 are perspective views respectively showing a vapor-phase mesh member and a liquid-phase mesh member.
Figure 3B:
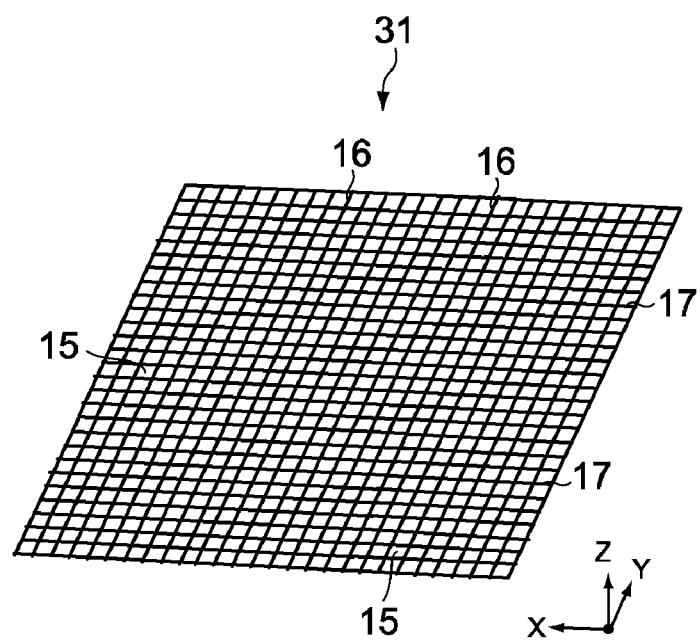

FIG. 3 are perspective views respectively showing the vapor-phase mesh member and the liquid-phase mesh member. Further, FIG. 4 is an enlarged plan view of the vapor-phase mesh member and the liquid-phase mesh member.

Figure 4:
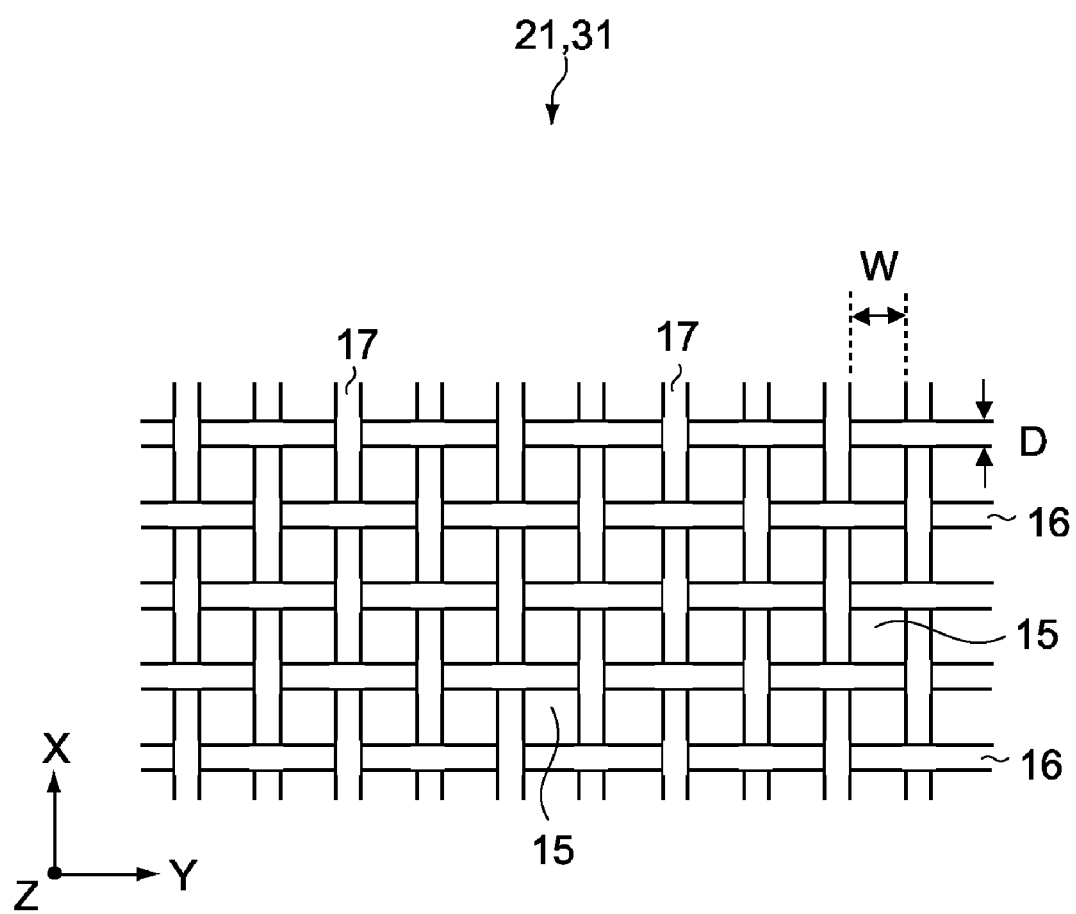
FIG. 4 is an enlarged plan view of the vapor-phase mesh member and the liquid-phase mesh member.

As shown in FIG. 4, the vapor-phase mesh member 21 and the liquid-phase mesh member 31 each include a plurality of first wires 16 that extend in the y-axis direction (flow-path direction) and a plurality of second wires 17 that extend in the x-axis direction (direction orthogonal to flow-path direction). The vapor-phase mesh member 21 and the liquid-phase mesh member 31 are each formed by weaving the plurality of first wires 16 and the plurality of second wires 17 in mutually-orthogonal directions.

As a way to weave the wires to obtain the vapor-phase mesh member 21 and the liquid-phase mesh member 31, there are, for example, plain weave and twilling. However, the present invention is not limited thereto, and lock crimp weave, flat-top weave, or other weaving methods may also be used.

A plurality of holes 15 are formed by spaces defined by the first wires 16 and the second wires 17. In the specification, holes formed by wires like the holes 15 may be referred to as meshes. In addition, intervals W among the first wires 16 and intervals W among the second wires 17 may each be referred to as open stitch W, and a diameter D of each of the first wires 16 and a diameter of each of the second wires 17 may be referred to as wire diameter D.

As shown in FIG. 3A, the vapor-phase mesh member 21 includes a plurality of through-holes 5 that are each larger than a mesh thereof. The plurality of through-holes 5 are arranged in the y- and x-axis directions at predetermined intervals, for example. A shape of the through-holes 5 is, for example, a circle, and a diameter of each of the through-holes 5 is, for example, about 5 mm to 10 mm, though not limited thereto. The size of the through-holes 5 only needs to be set in consideration of a size, roughness of meshes, and the like of the vapor-phase mesh member 21.

The through-holes 5 are formed by, for example, press work. In this case, the through-holes 5 may be formed on the vapor-phase mesh member 21 simultaneous with the cut-out of the vapor-phase mesh member 21 into an arbitrary size. Thus, the number of processes can be reduced. The method of forming the through-holes 5 is not limited to press work, and the through-holes 5 may be formed by laser irradiation or by other methods, for example.

As the vapor-phase mesh member 21, a mesh member that has rougher meshes than the liquid-phase mesh member 31 is used. Typically, a mesh number of the vapor-phase mesh member 21 is smaller than that of the liquid-phase mesh member 31. The "mesh number" used herein refers to the number of meshes of the mesh member per inch (25.4 mm).

For example, the mesh number of the vapor-phase mesh member 21 is about $1/3$ to $1/20$ the mesh number of the liquid-phase mesh member 31, though not limited thereto.

In descriptions below, a reason why the through-holes 5 are formed on the vapor-phase mesh member 21 will be described from a viewpoint of a capillary radius of the vapor-phase flow path 11.

For explaining the reason, a relationship between the capillary radius and heat-transporting performance will be described while taking a heat-transporting device according to a comparative example as an example.

Figure 5:
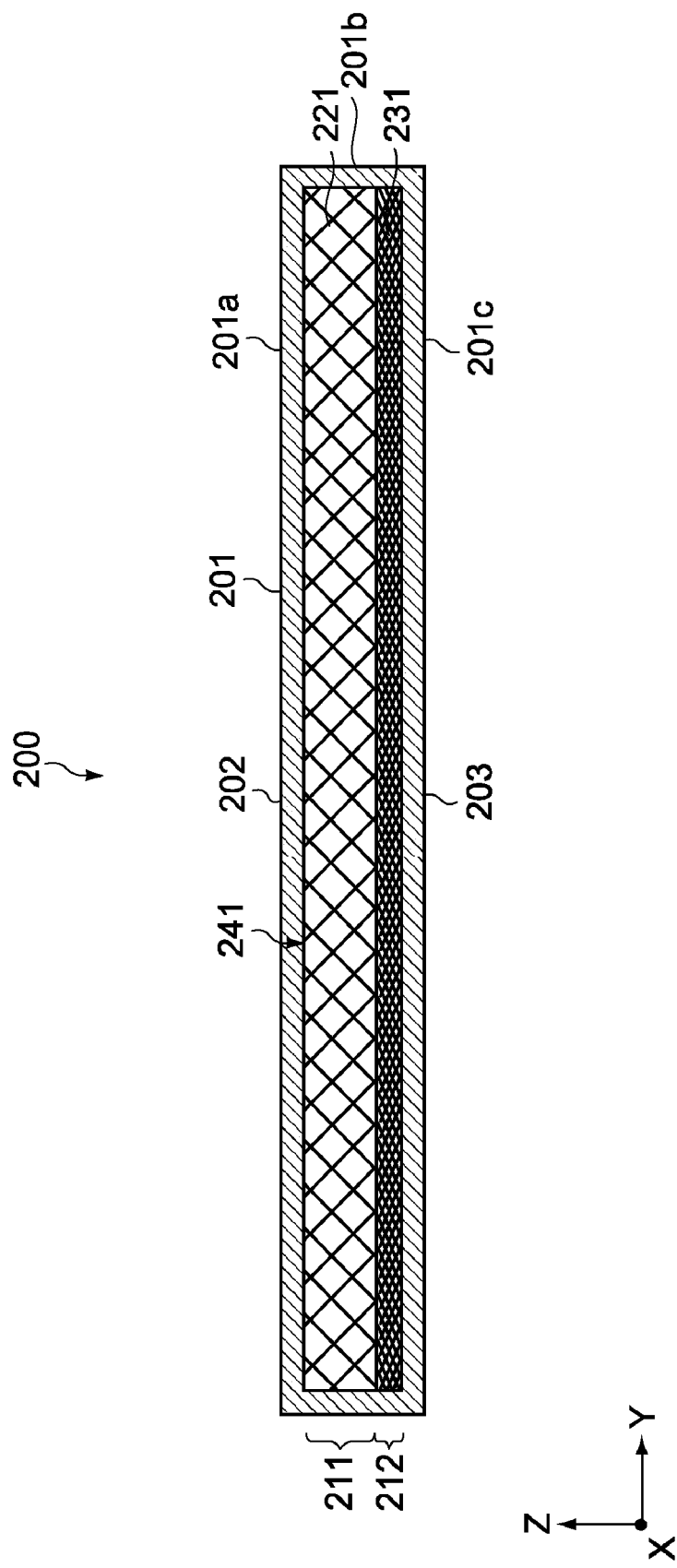
FIG. 5 is a cross-sectional side view of a heat-transporting device according to a comparative example.

FIG. 5 is a cross-sectional side view of the heat-transporting device according to the comparative example.

As shown in FIG. 5, a heat-transporting device 200 includes a vessel 201. A laminated body 241 is disposed inside the vessel 201. The laminated body 241 includes a vapor-phase mesh member 221 that constitutes a vapor-phase flow path 211 and a liquid-phase mesh member 231 that constitutes a liquid-phase flow path 212. It should be noted that in the heat-transporting device 200 according to the comparative example, the through-holes 5 are not formed on the vapor-phase mesh member 221.

Next, a typical operation of the heat-transporting device according to the comparative example will be described.

Figure 6:
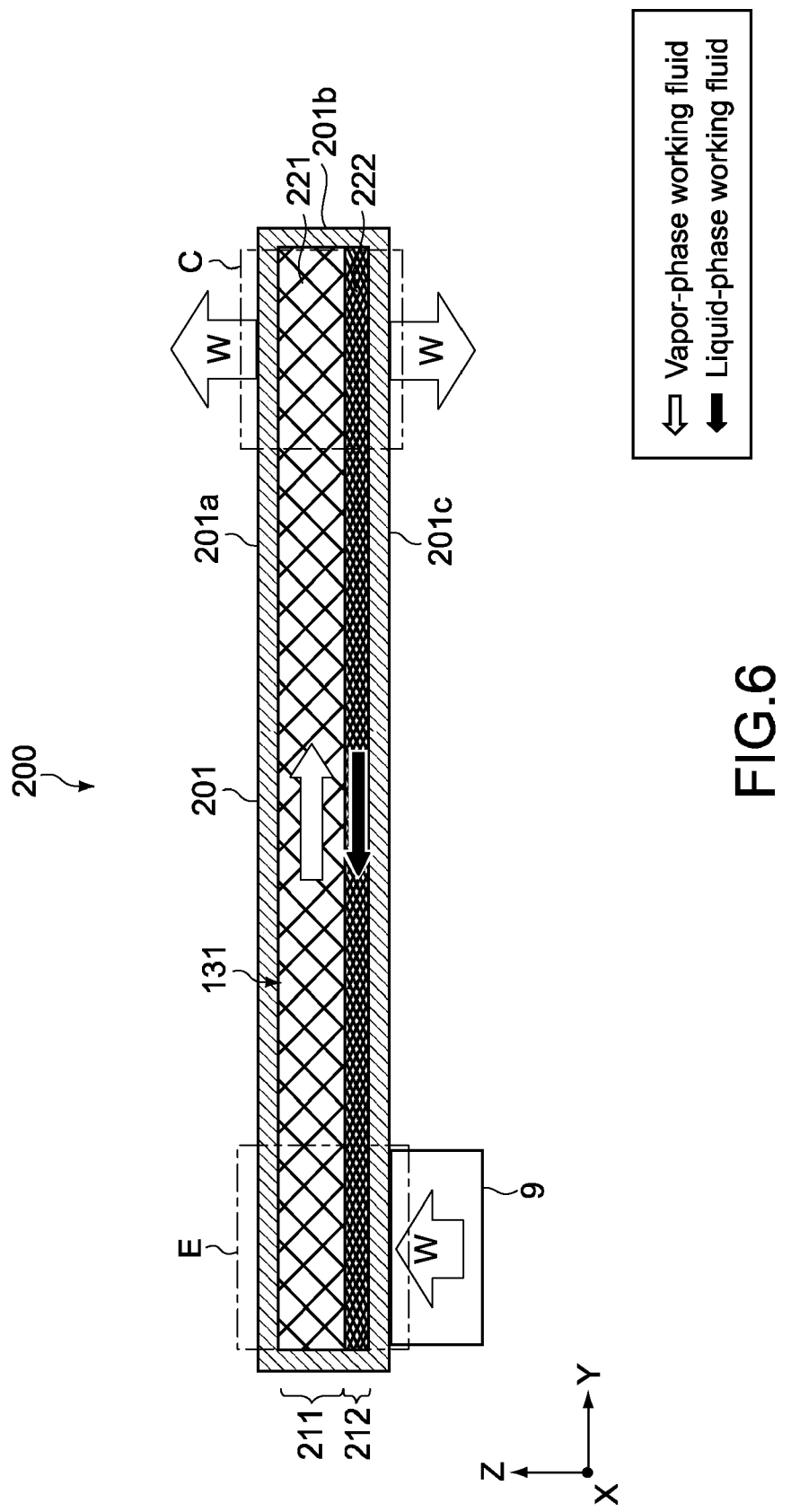
FIG. 6 is a schematic diagram for explaining an operation of the heat-transporting device according to the comparative example.
Figure 7:
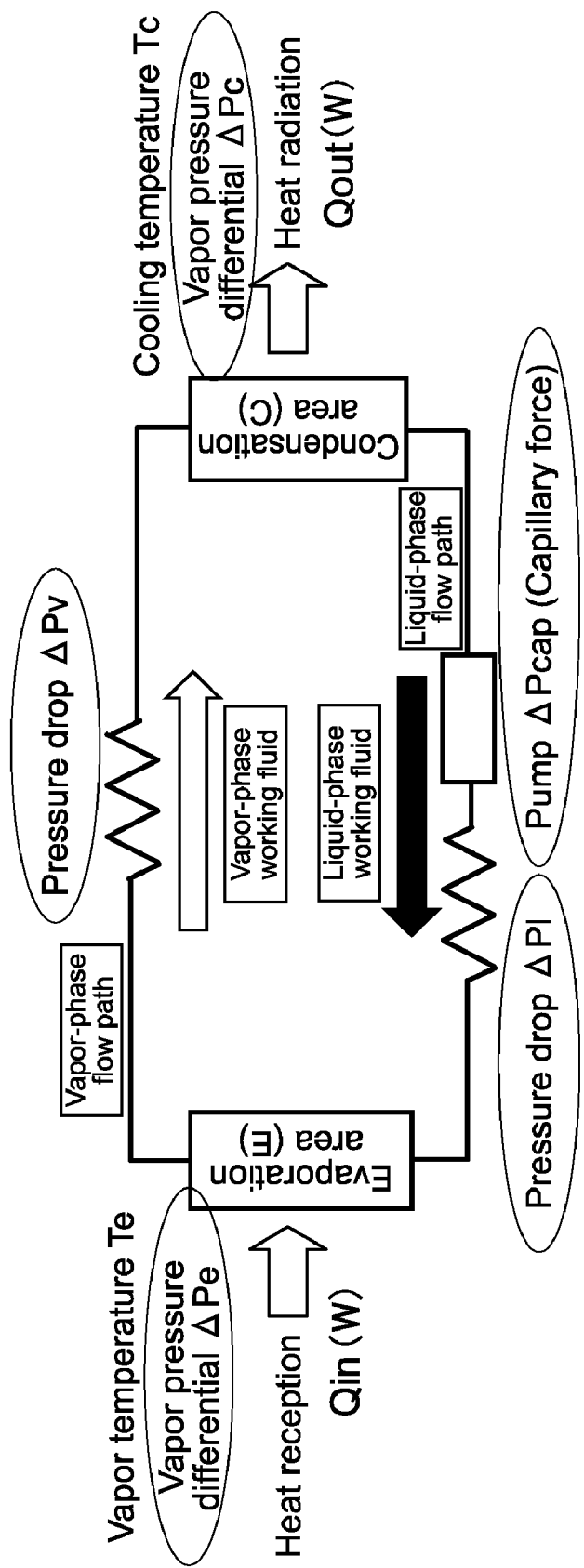
FIG. 7 is a cooling model diagram of the heat-transporting device according to the comparative example.

FIG. 6 is a schematic diagram for explaining an operation of the heat-transporting device according to the comparative example. Further, FIG. 7 is a cooling model diagram of the heat-transporting device.

As shown in the figures, the heat-transporting device 200 is in contact with, at one end portion thereof on the lower portion 201c side, a heat source 9 such as a CPU, for example. The heat-transporting device 200 includes an evaporation area E at an end portion thereof on a side that is in contact with the heat source 9 and a condensation area C at the other end portion thereof.

Receiving heat from the heat source 9, the liquid-phase working fluid evaporates by a vapor pressure differential $\Delta Pe$ to thus become a vapor-phase working fluid in the evaporation area E. The vapor-phase working fluid moves from the evaporation area E to the condensation area C via the vapor-phase flow path 211. At this time, the vapor-phase working fluid moves to the condensation area C while receiving a pressure drop $\Delta Pv$ due to a vapor-phase resistance of the vapor-phase flow path 211.

The vapor-phase working fluid that has moved to the condensation area C radiates the heat W and is then condensed, and a phase thereof is changed so that the vapor-phase working fluid becomes the liquid-phase working fluid. The vapor pressure differential at this time is represented by $\Delta Pc$. The liquid-phase working fluid flows through the liquid-phase flow path 212 with a capillary force $\Delta Pcap$ of the liquid-phase mesh member 231 as a pumping force and thus moves to the evaporation area E from the condensation area C. At this time, the liquid-phase working fluid moves to the evaporation area E while receiving a liquid-phase resistance $\Delta Pl$ of the liquid-phase flow path 212.

The liquid-phase working fluid that has returned to the evaporation area E again receives heat from the heat source 9 and evaporates. By repeating the above operation, heat from the heat source 9 is transported.

When a total pressure drop of the heat-transporting device 200 is smaller than the capillary force $\Delta Pcap$ of the liquid-phase mesh member 231, the heat-transporting device 200 operates. Conversely, when the total pressure drop is larger than the capillary force $\Delta Pcap$ of the liquid-phase mesh member 231, the heat-transporting device 200 does not operate. A maximum heat-transporting amount Qmax of the heat-transporting device 200 can be obtained when the total pressure drop and the capillary force are balanced.

Therefore, $\Delta Pcap$ with which the maximum heat-transporting amount Qmax can be obtained is expressed by Equation (1) below. It should be noted that in Equation (1), a pressure drop of the vapor-phase working fluid is represented by $\Delta Pv$, a pressure drop of the liquid-phase working fluid is represented by $\Delta Pl$, a pressure differential due to evaporation is represented by $\Delta Pe$, a pressure differential due to condensation is represented by $\Delta Pc$, and a pressure differential due to a volume force is represented by $\Delta Ph$.

$$\Delta Pcap = \Delta Pv + \Delta Pl + \Delta Pe + \Delta Pc + \Delta Ph \quad (1)$$

Here, assuming that a flow-path resistance per unit heat quantity is represented by Rq, the maximum heat-transporting amount Qmax can be expressed by Equation (2) below.

$$Qmax = \Delta Pcap / Rq \quad (2)$$

Moreover, assuming that latent heat is represented by H and a total flow-path resistance is represented by Rtotal, the maximum heat-transporting amount Qmax can be expressed by Equation (3) below.

$$Qmax = \Delta Pcap * H / Rtotal \quad (3)$$

The total flow-path resistance Rtotal is a sum of a vapor-phase resistance Rv, a liquid-phase resistance Rl, a boiling resistance Re, a condensation resistance Rc, and a resistance due to a volume force Rb. Therefore, in general, the maximum heat-transporting amount Qmax increases as the capillary force $\Delta Pcap$ increases and decreases as the liquid-phase resistance Rl increases.

The pressure drop $\Delta Pv$ of the vapor-phase working fluid, the pressure drop $\Delta Pl$ of the liquid-phase working fluid, the pressure differential $\Delta Pe$ due to evaporation, the pressure differential $\Delta Pc$ due to condensation, and the pressure differential $\Delta Ph$ due to the volume force Rb can be respectively expressed by Equations (4) to (8) below. In Equations (4) to (8), a viscosity coefficient of the vapor-phase working fluid is represented by $\mu v$, a viscosity coefficient of the liquid-phase working fluid is represented by $\mu l$, a density of the vapor-phase working fluid is represented by $\rho v$, and a density of the liquid-phase working fluid is represented by $\rho l$. Moreover, a heat-transporting amount is represented by Q, a length of the heat-transporting device 200 is represented by L, a length of the evaporation area E is represented by le, a length of the condensation area C is represented by lc, a cross-sectional area of the liquid-phase mesh member 231 is represented by Aw, and a capillary radius of the vapor-phase flow path 211 is represented by rv. In addition, an infiltration coefficient is represented by K, a vapor constant is represented by R, a gravity acceleration is represented by g, and a tilt of the heat-transporting device 200 with respect to a horizontal direction is represented by $\phi$. It should be noted that the volume force Rb becomes 0 at a time the heat-transporting device 200 is used horizontally.

$$\Delta Pv = 8 * \mu v * Q * L / (\pi * \rho v * rv^4 * H) \quad (4)$$

$$\Delta Pl = \mu l * Q * L / (K * Aw * \rho l * H) \quad (5)$$

$$\Delta Pe = (RT/2\pi)^{(1/2)} * Q / [\alpha c(H - 1/2 * RT) * rv * le] \quad (6)$$

$$\Delta Pc = (RT/2\pi)^{(1/2)} * Q / [\alpha c(H - 1/2 * RT) * rv * lc] \quad (7)$$

$$\Delta Ph = (\rho l - \rho v) * g * L * \sin\phi \quad (8)$$

Focusing on Equations (4), (6), and (7) out of Equations (4) to (8) above, it can be seen that the pressure drop $\Delta Pv$ of the vapor-phase working fluid, the pressure differential $\Delta Pe$ due to evaporation, and the pressure differential $\Delta Pc$ due to condensation are functions of the capillary radius rv of the vapor-phase flow path 211. The capillary radius rv of the vapor-phase flow path 211 is used as a denominator in all of Equations (4), (6), and (7). Therefore, it can be seen that it is possible to reduce the three pressure drops ΔPv, ΔPe, and ΔPc and increase the maximum heat-transporting amount Qmax by widening the capillary radius ry of the vapor-phase flow path 211.

Here, a capillary radius r of a flow path that causes the working fluid to circulate will be described.

Figure 8A:
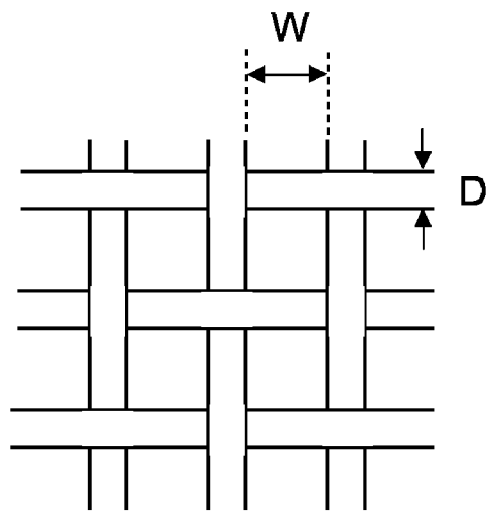
FIG. 8 are diagrams for explaining a capillary radius.
Figure 8B:
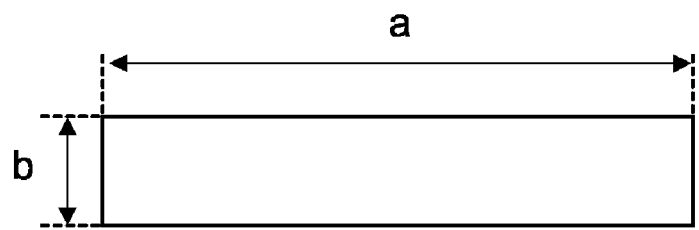

FIG. 8 are diagrams for explaining a capillary radius. FIG. 8A is a diagram for explaining a capillary radius in a case where a flow path of a working fluid is constituted of a mesh member. FIG. 8B is a diagram for explaining a capillary radius in a case where the flow path of the working fluid is a rectangular flow path.

As shown in FIG. 8A, when the flow path of the working fluid is constituted of a mesh member, the capillary radius r is expressed by Equation (9) below. It should be noted that in Equation (9), an open stitch is represented by W and a wire diameter is represented by D.

$$r = (W+D)/2 \quad (9)$$

On the other hand, when the flow path of the working fluid is constituted of a rectangular flow path as shown in FIG. 8B, the capillary radius r is expressed by Equation (10) below. It should be noted that in Equation (10), a width of the flow path is represented by a and a depth of the flow path is represented by b.

$$r = ab/(a+b) \quad (10)$$

In the heat-transporting device 200 according to the comparative example, the vapor-phase flow path 211 is constituted of the vapor-phase mesh member 221. Therefore, the capillary radius ry of the vapor-phase flow path 211 is expressed by Equation (9) above.

As described above, for increasing the maximum heat-transporting amount Qmax, the capillary radius rv of the vapor-phase flow path 211 only needs to be increased.

In this regard, in the heat-transporting device 10 of this embodiment, the through-holes 5 are provided in the vapor-phase mesh member 21 that constitutes the vapor-phase flow path 11. Since the capillary radius rv of the vapor-phase flow path 11 can be practically widened by the through-holes 5, the pressure drop ΔPv of the vapor-phase working fluid, the pressure differential ΔPe due to evaporation, and the pressure differential ΔPc due to condensation can be reduced (see Equations (4), (6), and (7)). Accordingly, the maximum heat-transporting amount Qmax of the heat-transporting device 10 can be increased, with the result that the heat-transporting performance of the heat-transporting device 10 can be improved.

Description on Operation

Figure 9:
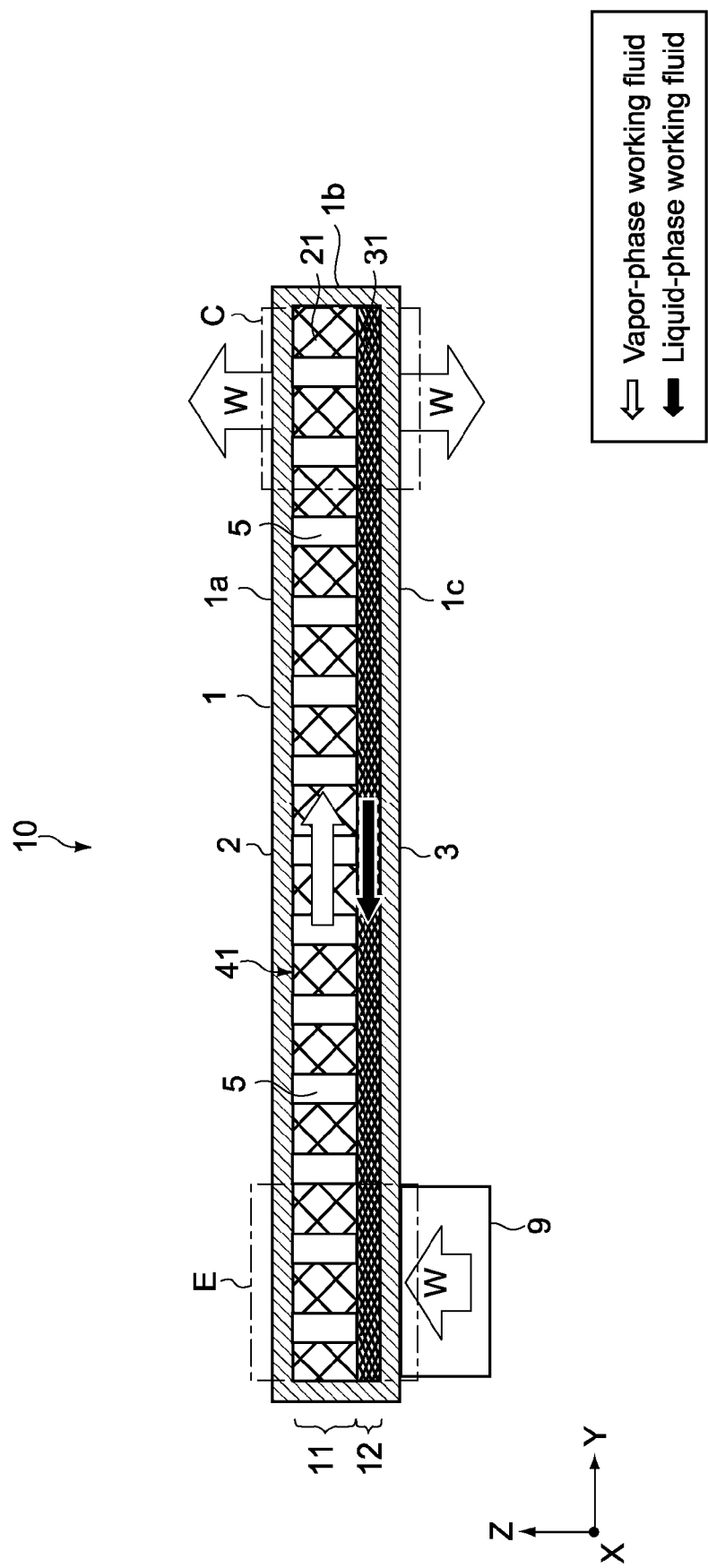
FIG. 9 is a schematic diagram for explaining an operation of the heat-transporting device.

Next, an operation of the heat-transporting device 10 will be described. FIG. 9 is a schematic diagram for explaining the operation of the heat-transporting device.

In FIG. 9, points different from those of the operation described with reference to FIGS. 6 and 7 will mainly be described.

As shown in FIG. 9, the heat-transporting device 10 is in contact with, at one end portion thereof on the lower portion lc side, the heat source 9 such as a CPU, for example. The heat-transporting device 10 includes the evaporation area E at an end portion thereof on a side that is in contact with the heat source 9 and the condensation area C at the other end portion thereof.

The liquid-phase working fluid absorbs heat W from the heat source 9 and evaporates by the vapor pressure differential ΔPe in the evaporation area E. At this time, since the capillary radius ry of the vapor-phase flow path 11 is practically widened by the through-holes 5 as described above, the pressure differential ΔPe due to evaporation is reduced (see Equation (6)). Therefore, it is possible for the liquid-phase working fluid to evaporate with a low boiling resistance.

The working fluid that has evaporated (vapor-phase working fluid) moves toward the condensation area C from the evaporation area E via the liquid-phase flow path 12. At this time, since the pressure drop ΔPv of the vapor-phase working fluid is reduced by the through-holes 5 (see Equation (4)), the vapor-phase working fluid is capable of moving to the condensation area C with a low flow-path resistance. Because the pressure drop ΔPv of the vapor-phase working fluid is inversely proportional to a quadruplicate of the capillary radius ry of the vapor-phase flow path 11, an effect of reducing the pressure drop ΔPv by widening the capillary radius ry is particularly large.

The vapor-phase working fluid that has reached the condensation area C radiates the heat W and is condensed by the vapor pressure differential ΔPc. At this time, since the pressure differential ΔPc due to condensation is reduced by the through-holes 5 (see Equation (7)), the vapor-phase working fluid can be condensed with a low condensation resistance.

The condensed working fluid (liquid-phase working fluid) moves from the condensation area C to the evaporation area E via the liquid-phase flow path 12 using a capillary force of the liquid-phase mesh member 31. The liquid-phase working fluid that has returned to the evaporation area E again receives heat from the heat source 9 and evaporates. By repeating the operation above, heat from the heat source 9 is transported.

As described above, in the heat-transporting device 10 of this embodiment, the pressure drop ΔPv of the vapor-phase working fluid, the pressure differential ΔPe due to evaporation, and the pressure differential ΔPc due to condensation can be reduced. Accordingly, since a total pressure drop Ptotal can be reduced, the maximum heat-transporting amount Qmax of the heat-transporting device 10 can be increased. As a result, the heat-transporting performance of the heat-transporting device 10 can be improved.

Further, since the vapor-phase flow path 11 is constituted of the vapor-phase mesh member 21 in this embodiment, durability of the heat-transporting device 10 can be enhanced as compared to a case where the vapor-phase flow path is hollow. For example, it becomes possible to prevent the vessel 1 from being deformed due to a pressure at a time an internal temperature of the heat-transporting device 10 increases or a time a working fluid is injected into the heat-transporting device 10 in a reduced-pressure state. In addition, it is possible to enhance durability of the heat-transporting device 10 in a case where the heat-transporting device 10 is subjected to a bending process.

Furthermore, since the vapor-phase flow path 11 and the liquid-phase flow path 12 are respectively constituted of the mesh members 21 and 31 in this embodiment, a structure is extremely simple. Therefore, it is possible to easily produce a heat-transporting device 10 that has high heat-transporting performance and high durability. Moreover, costs can also be reduced.

Figure 10:
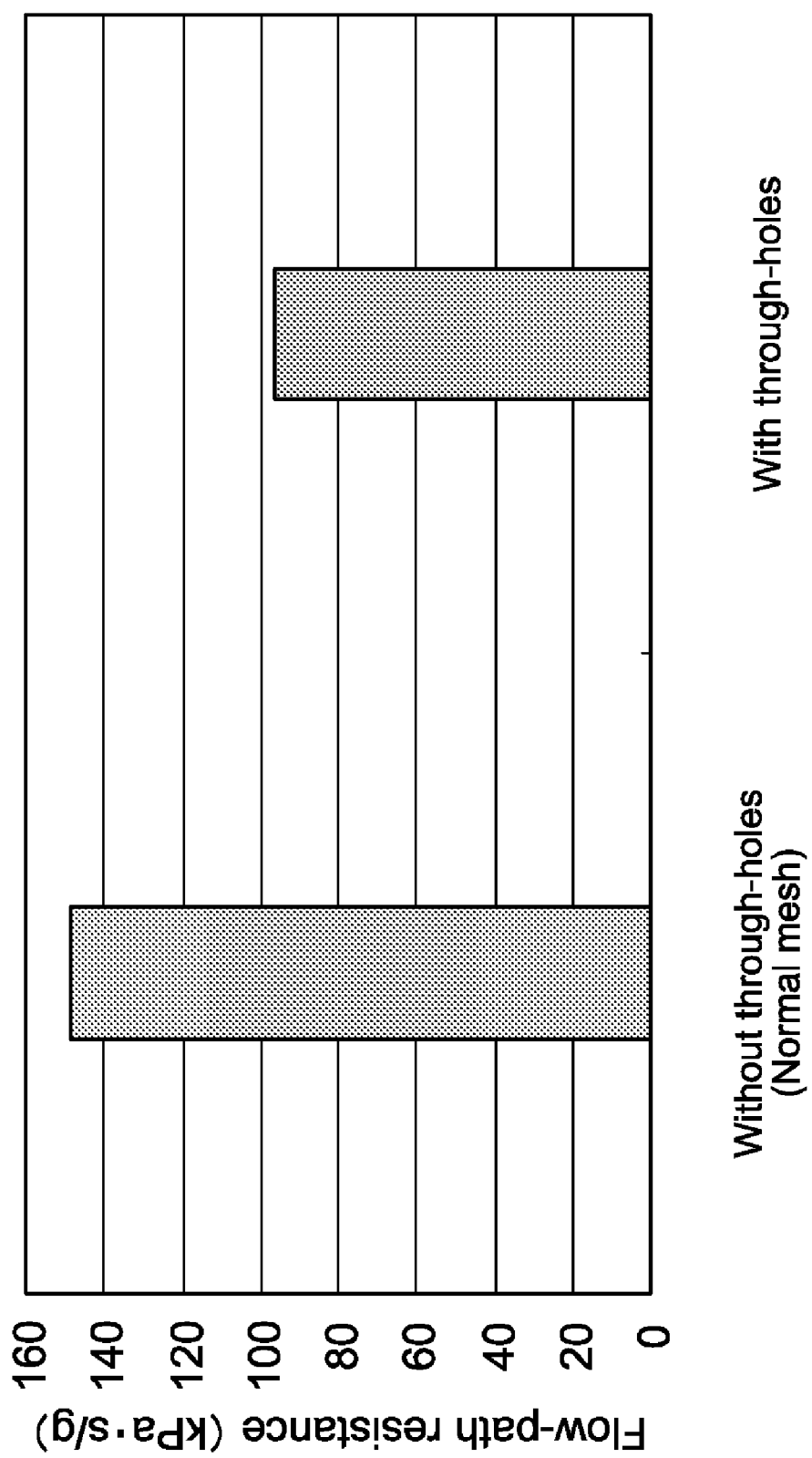
FIG. 10 is a diagram showing a flow-path resistance of a vapor-phase flow path in each of the heat-transporting device according to the embodiment of the present invention and the heat-transporting device according to the comparative example.
Figure 11:
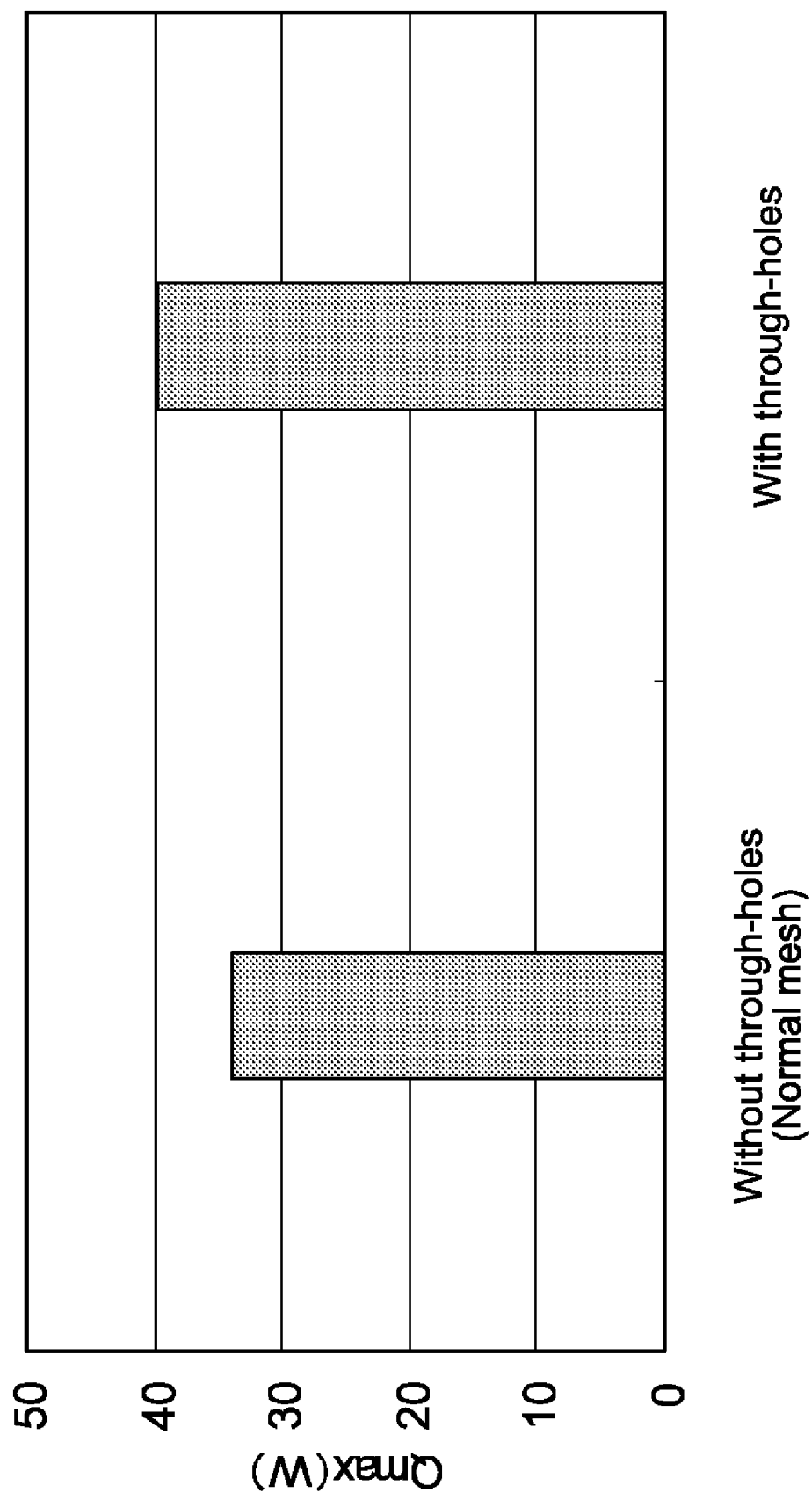
FIG. 11 is a diagram showing a maximum heat-transporting amount Qmax of each of the heat-transporting device according to the embodiment of the present invention and the heat-transporting device according to the comparative example.

FIG. 10 is a diagram showing a flow-path resistance of the vapor-phase flow path in each of the heat-transporting device of this embodiment and the heat-transporting device according to the comparative example. FIG. 11 is a diagram showing a maximum heat-transporting amount Qmax of each of the heat-transporting device 10 of this embodiment and the heat-transporting device 200 according to the comparative example.

For evaluating the flow-path resistance and heat-transporting performance of the heat-transporting device 10, the inventors of the present invention prepared a heat-transporting device 10 including the vapor-phase mesh member 21 having through-holes 5 and a heat-transporting device 200 including the vapor-phase mesh member 221 without the through-holes 5 (see FIG. 5).

As shown in FIG. 10, the flow-path resistance of the vapor-phase flow path 11 in the structure including the through-holes 5 is dramatically decreased as compared to the flow-path resistance of the vapor-phase flow path 211 in the structure without the through-holes 5.

Moreover, it can be seen from FIG. 11 that the maximum heat-transporting amount Qmax in the structure including the through-holes 5 is dramatically increased as compared to the maximum heat-transporting amount Qmax in the structure without the through-holes 5. In other words, the heat-transporting performance of the heat-transporting device that includes the through-holes 5 is dramatically improved as compared to the heat-transporting performance of the heat-transporting device that does not include the through-holes 5.

The reason why such a result is obtained is because, as described above, the substantial capillary radius rv of the vapor-phase flow path 11 is widened by the through-holes 5.

Modified Example

FIG. 3 have shown an example where the through-holes 5 are circular. However, the shape of the through-holes 5 is not limited to a circle. For example, the through-holes 5 may each take a shape of an oval, a polygonal, or a star. Alternatively, at least two shapes out of a circle, an oval, a polygon, and a star may be combined.

Figure 12A:
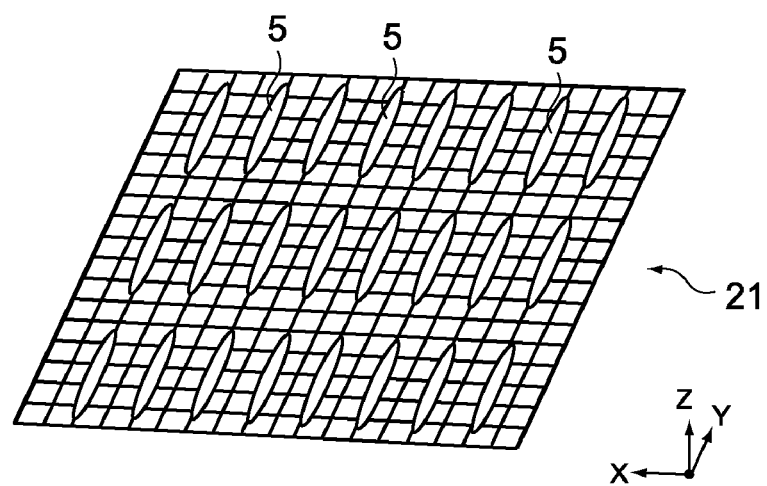
FIG. 12 are diagrams showing examples of other shapes of a through-hole.
Figure 12B:
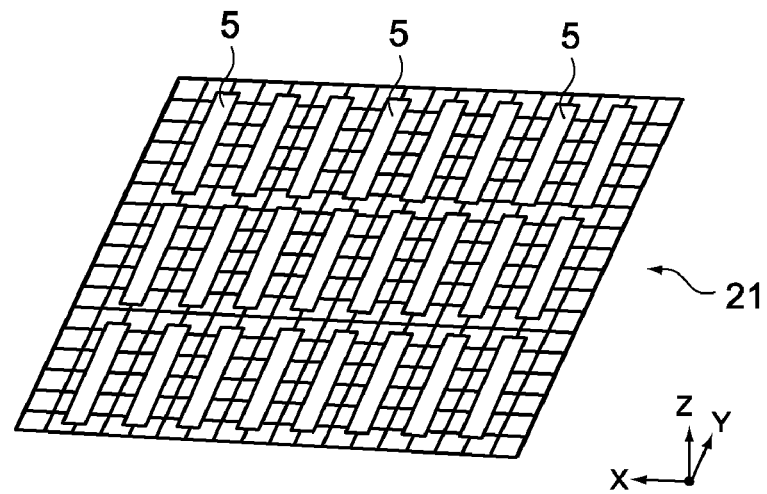
Figure 12C:
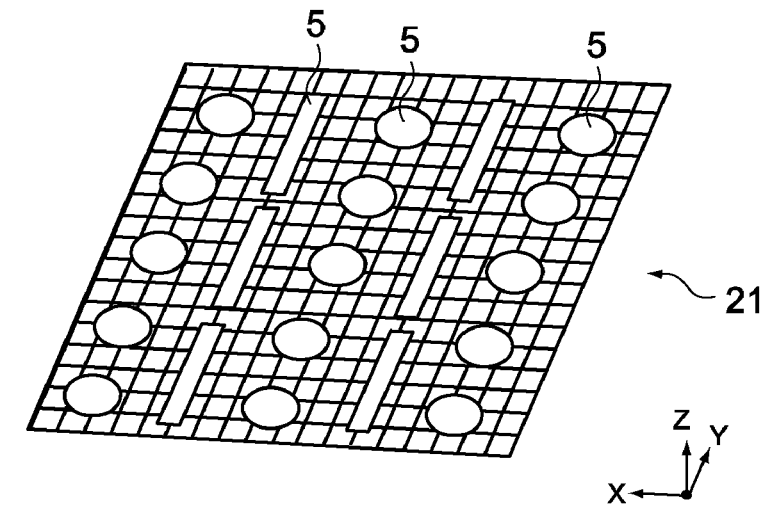

FIG. 12 are diagrams showing examples of other shapes of the through-holes 5. FIG. 12A is a diagram showing oval through-holes 5, and FIG. 12B is a diagram showing rectangular through-holes 5. FIG. 12C is a diagram showing a combination of circular and rectangular through-holes 5.

Figure 13:
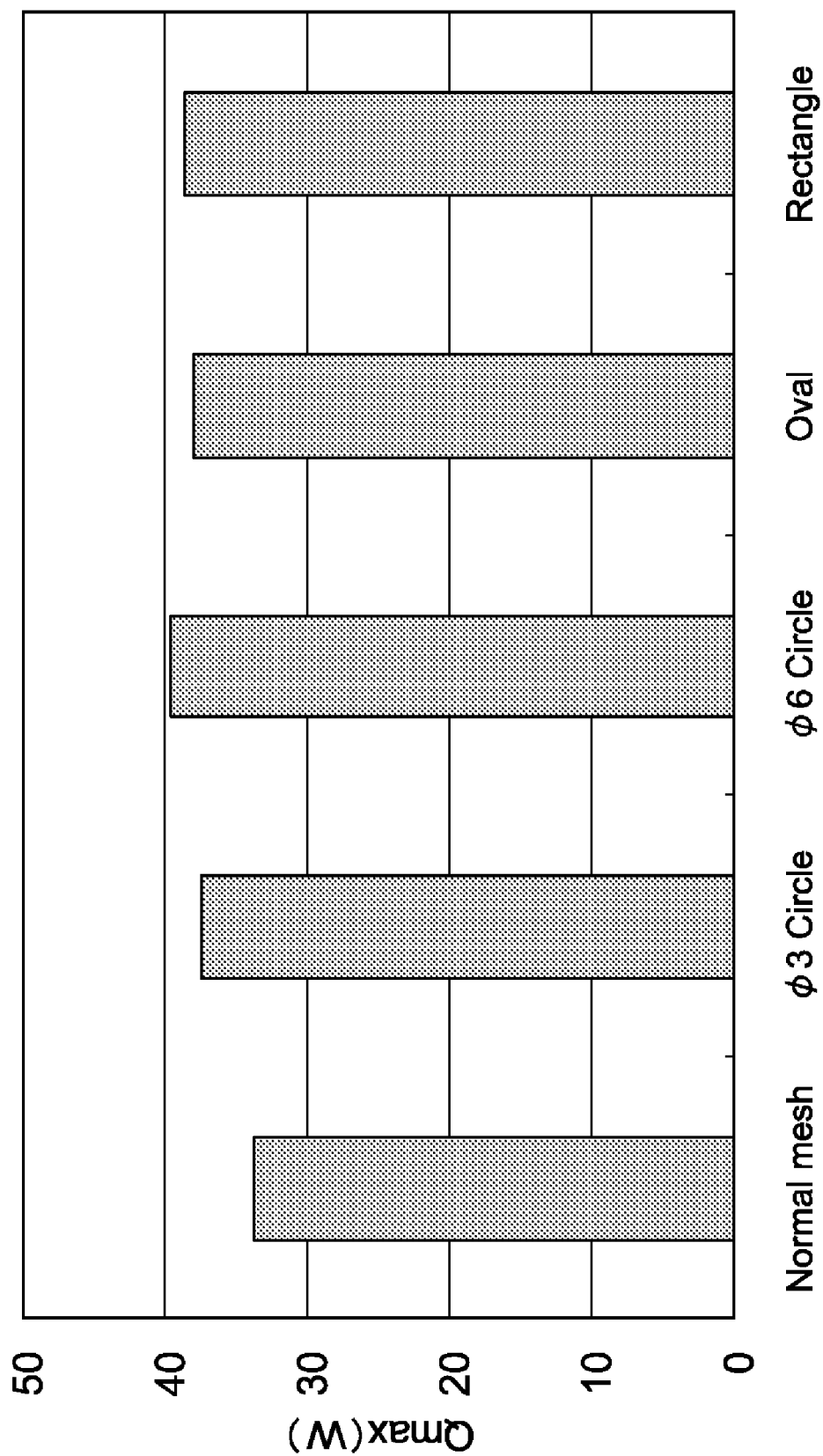
FIG. 13 is a diagram showing a relationship between the shape of a through-hole and the maximum heat-transporting amount Qmax.

FIG. 13 is a diagram showing a relationship between the shape of the through-holes 5 and the maximum heat-transporting amount Qmax.

As shown in FIG. 13, the maximum heat-transporting amounts Qmax are increased in cases where the through-holes 5 are provided as compared to a case where the through-holes 5 are not provided (smallest graph). Further, irrespective of the shape of the through-holes 5, the maximum heat-transporting amount Qmax is increased as compared to the case where the through-holes 5 are not provided.

Second Embodiment

Next, a second embodiment of the present invention will be described.

The second embodiment is different from the first embodiment in that through-holes 5P provided in a flow-path area P that mainly functions as a flow path are larger than through-holes 5E and 5C provided in the evaporation area E and the condensation area C, respectively. Therefore, that point will mainly be described.

It should be noted that in descriptions below, components that have the same structures and functions as those of the first embodiment above are denoted by the same symbols, and descriptions thereof will be omitted or simplified.

Figure 14:
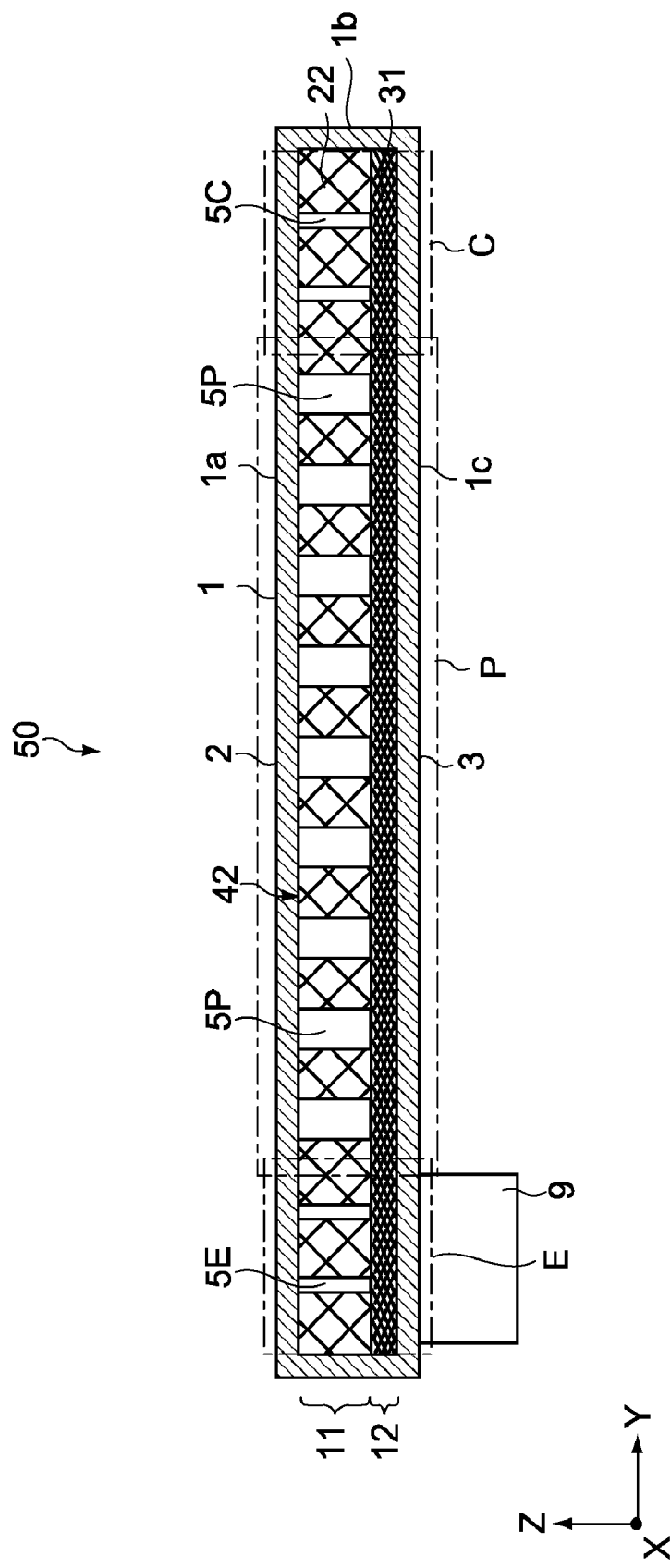
FIG. 14 is a cross-sectional side view of a heat-transporting device according to another embodiment of the present invention.

FIG. 14 is a cross-sectional side view of a heat-transporting device according to the second embodiment.

As shown in FIG. 14, a heat-transporting device 50 is in contact with, at one end portion thereof in the longitudinal direction (y-axis direction), the heat source 9 such as a CPU. The heat-transporting device 50 includes the evaporation area E at an end portion thereof on a side that is in contact with the heat source 9 and the condensation area C at the other end portion thereof. The heat-transporting device 50 also includes a flow-path area P that is interposed between the evaporation area E and the condensation area C and mainly functions as a flow path of a working fluid.

The heat-transporting device 50 includes, inside the vessel 1, a laminated body 42. The laminated body 42 includes a vapor-phase mesh member 22 and the liquid-phase mesh member 31. The vapor-phase mesh member 22 constitutes the vapor-phase flow path 11 that causes the vapor-phase working fluid to circulate, and the liquid-phase mesh member 31 constitutes the liquid-phase flow path 12 that causes the liquid-phase working fluid to circulate.

In the vapor-phase mesh member 22, the through-holes 5E are provided in the evaporation area E and the through-holes 5C are provided in the condensation area C. Further, the through-holes 5P are provided in the flow-path area P. In descriptions below, the through-holes 5E provided in the evaporation area E, the through-holes 5C provided in the condensation area C, and the through-holes 5P provided in the flow-path area P will be referred to as evaporation through-holes 5E, condensation through-holes 5C, and flow-path through-holes 5P, respectively.

The flow-path through-holes 5P are formed to be larger than the evaporation through-holes 5E and the condensation through-holes 5C. For example, a diameter of each of the flow-path through-holes 5P is set to 6 mm, whereas a diameter of each of the evaporation through-holes 5E and the condensation through-holes 5C is set to 3 mm. However, sizes of the through-holes 5P, 5E, and 5C are not limited thereto. The flow-path through-holes 5P only need to be formed to be larger than the evaporation through-holes 5E and the condensation through-holes 5C, and the values of the through-holes 5P, 5E, and 5C can be changed as appropriate.

Next, a reason why the flow-path through-holes 5P are formed to be larger than the evaporation through-holes 5E and the condensation through-holes 5C will be described.

As described above, the pressure drop $\Delta Pv$ of the vapor-phase working fluid at a time it passes through the vapor-phase flow path 11 is expressed by Equation (4) above. In Equation (4), the capillary radius rv of the vapor-phase flow path 11 is used as a denominator on the right-hand side of Equation (4), and the pressure drop $\Delta Pv$ of the vapor-phase working fluid is inversely proportional to a quadruplicate of the capillary radius rv of the vapor-phase flow path 11.

On the other hand, the pressure differential $\Delta Pe$ due to evaporation and the pressure differential $\Delta Pc$ due to condensation are respectively expressed by Equations (6) and (7) above. Also in Equations (6) and (7), the capillary radius rv of the vapor-phase flow path 11 is used as a denominator. In this case, the pressure differential $\Delta Pe$ due to evaporation and the pressure differential $\Delta Pc$ due to condensation are inversely proportional to the first power of the capillary radius rv of the vapor-phase flow path.

In this case, a rate by which the pressure drop $\Delta Pv$ decreases due to widening of the capillary radius rv of the vapor-phase flow path 11 is larger than a rate by which the pressure differential $\Delta Pe$ due to evaporation and the pressure differential $\Delta Pc$ due to condensation decrease.

In this regard, in the second embodiment, the flow-path through-holes 5P are formed to be larger than the evaporation through-holes 5E and the condensation through-holes 5C. With this structure, heat-transporting performance of the heat-transporting device 50 can be improved efficiently.

Modified Example

FIG. 14 has been described assuming that both the evaporation through-holes 5E and the condensation through-holes 5C are smaller than the flow-path through-holes 5P. However, the present invention is not limited thereto, and it is also possible to form either the evaporation through-holes 5E or the condensation through-holes 5C to be smaller than the flow-path through-holes 5P.

Incidentally, a clear distinction cannot be made between the evaporation area E and the flow-path area P. Similarly, a clear distinction cannot be made between the condensation area C and the flow-path area P. In this regard, for example, the through-holes 5P and 5E may gradually become smaller from the center of the heat-transporting device 50 toward the evaporation area E. Alternatively, the through-holes 5P and 5C may gradually become smaller from the center of the heat-transporting device 50 toward the condensation area C.

Alternatively, a structure in which at least one of the evaporation area E and the condensation area C is not provided with the corresponding through-holes 5E or 5C is also possible.

Figure 15:
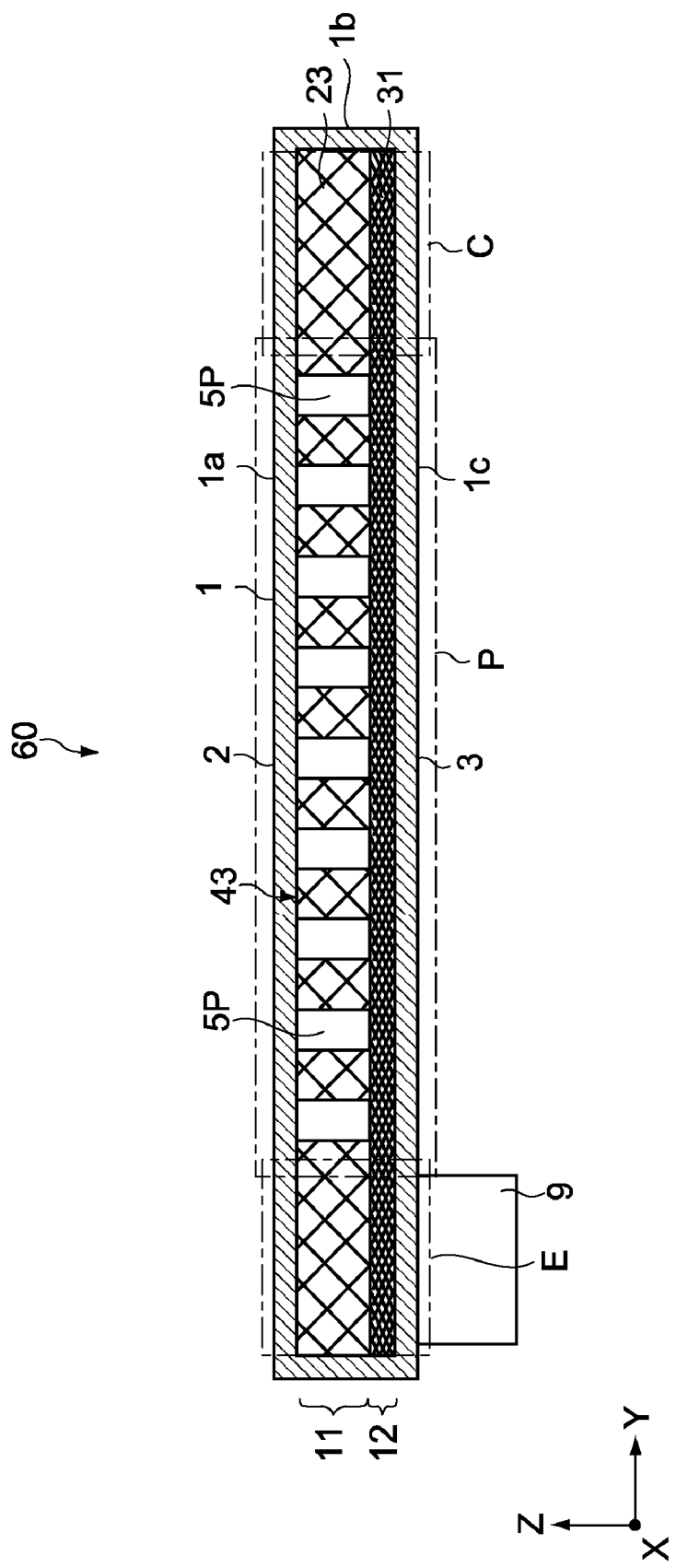
FIG. 15 is a cross-sectional side view of a heat-transporting device in which through-holes are provided in a flow-path area.

FIG. 15 is a cross-sectional side view of a heat-transporting device in which through-holes are not provided in both of the evaporation area E and the condensation area C, that is, only the flow-path through-holes 5P are provided in the flow-path area P.

Also in a heat-transporting device 60 that includes the flow-path through-holes 5P in the flow-path area P as shown in FIG. 15, heat-transporting performance is improved as compared to the heat-transporting device 200 that does not include the through-holes 5 (see FIG. 5).

Third Embodiment

Next, a third embodiment of the present invention will be described.

The second embodiment above has been described assuming that the flow-path through-holes 5P are larger than the evaporation through-holes 5E and the condensation through-holes 5C. In the third embodiment, however, the evaporation through-holes 5E and the condensation through-holes 5C are larger than the flow-path through-holes 5P. Thus, that point will mainly be described. It should be noted that in this embodiment, components that have the same structures and functions as those of the second embodiment above are denoted by the same symbols, and descriptions thereof will be omitted or simplified.

Figure 16:
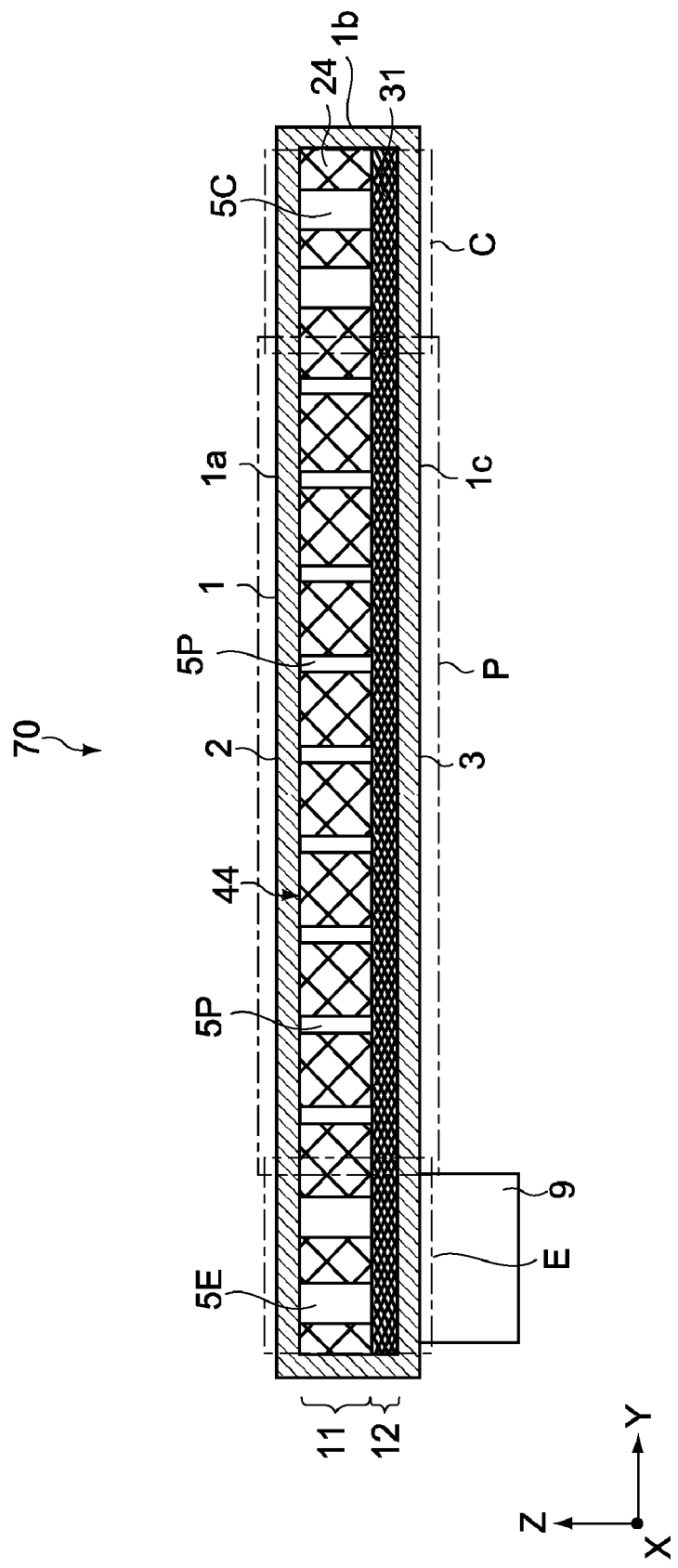
FIG. 16 is a cross-sectional side view of a heat-transporting device according to another embodiment of the present invention.

FIG. 16 is a cross-sectional side view of a heat-transporting device according to the third embodiment.

As shown in FIG. 16, a heat-transporting device 70 includes a laminated body 44 inside the vessel 1. The laminated body 44 includes a vapor-phase mesh member 24 that constitutes the vapor-phase flow path 11 and the liquid-phase mesh member 31 that constitutes the liquid-phase flow path 12.

In the vapor-phase mesh member 24, the evaporation through-holes 5E, the condensation through-holes 5C, and the flow-path through-holes 5P are provided in the evaporation area E, the condensation area C, and the flow-path area P, respectively.

The evaporation through-holes 5E and the condensation through-holes 5C are formed to be larger than the flow-path through-holes 5P. For example, the diameter of each of the evaporation through-holes 5E and the condensation through-holes 5C is set to 6 mm, whereas the diameter of each of the flow-path through-holes 5P is set to 3 mm. However, the sizes of the through-holes 5P, 5E, and 5C are not limited thereto. The evaporation through-holes 5E and the condensation through-holes 5C only need to be larger than the flow-path through-holes 5P, and the values of the through-holes 5P, 5E, and 5C can be changed as appropriate.

As described above, the pressure differential $\Delta Pe$ due to evaporation and the pressure differential $\Delta Pc$ due to condensation are inversely proportional to the capillary radius rv of the vapor-phase flow path 11. Therefore, even when the evaporation through-holes 5E and the condensation through-holes 5C are formed to be larger than the flow-path through-holes 5P, heat-transporting performance is improved as compared to the heat-transporting device 200 that does not include the through-holes 5 (see FIG. 5).

Modified Example

FIG. 16 has been described assuming that both the evaporation through-holes 5E and the condensation through-holes 5C are larger than the flow-path through-holes 5P. However, the present invention is not limited thereto, and it is also possible to form either the evaporation through-holes 5E or the condensation through-holes 5C to be larger than the flow-path through-holes 5P.

Alternatively, the through-holes 5P and 5E may gradually become larger from the center of the heat-transporting device 70 toward the evaporation area E. Alternatively, the through-holes 5P and 5C may gradually become larger from the center of the heat-transporting device 70 toward the condensation area C.

Alternatively, a structure in which the flow-path through-holes 5P are not provided in the flow-path area P is also possible.

Figure 17:
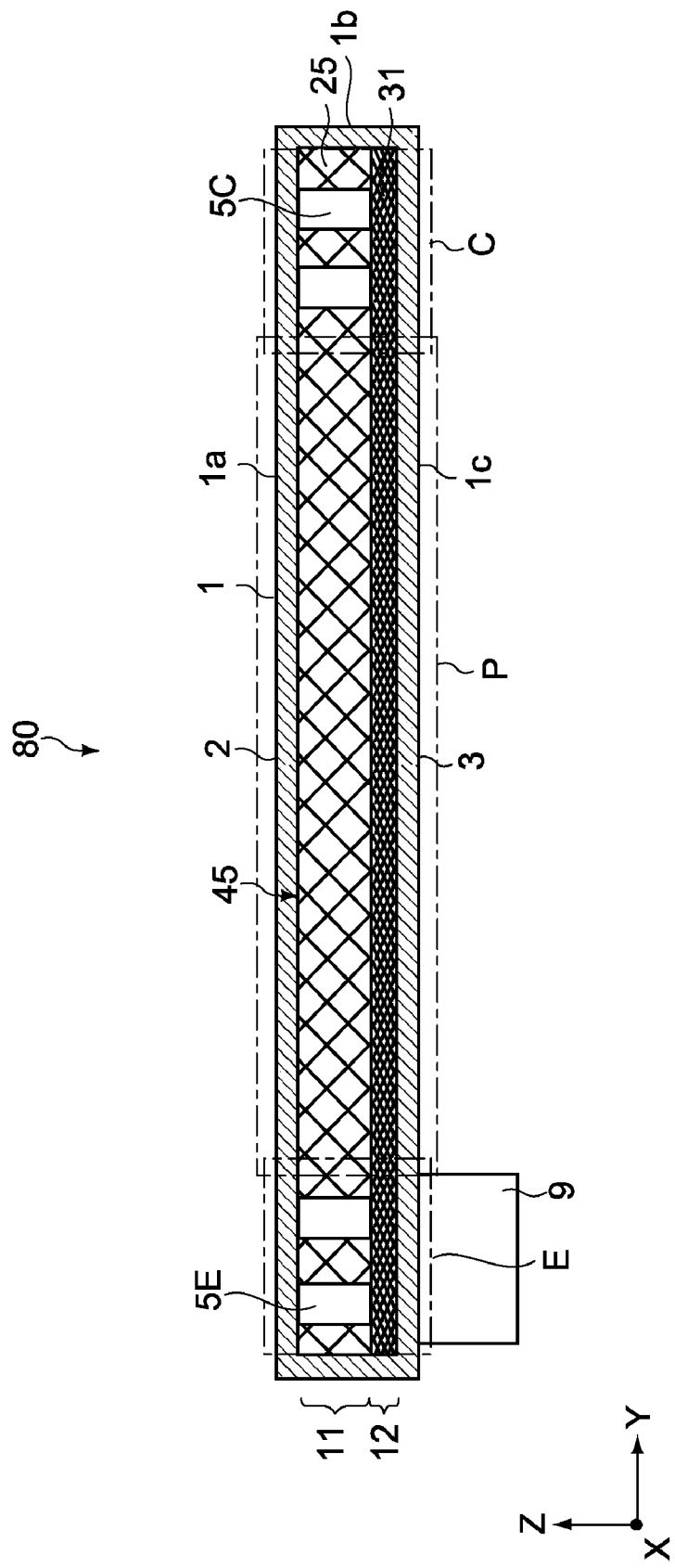
FIG. 17 is a cross-sectional side view of a heat-transporting device in which through-holes are provided in an evaporation area and a condensation area.

FIG. 17 is a cross-sectional side view of a heat-transporting device in which the flow-path through-holes 5P are not provided in the flow-path area P, that is, only the through-holes 5E and 5C are provided in the evaporation area E and the condensation area C, respectively.

Heat-transporting performance is also improved in a heat-transporting device 80 in which the evaporation through-holes 5E and the condensation through-holes 5C are provided as shown in FIG. 17. This is because, due to the evaporation through-holes 5E and the condensation through-holes 5C, the substantial capillary radius rv of the vapor-phase flow path 11 is widened and the pressure differential $\Delta Pe$ due to evaporation and the pressure differential $\Delta Pc$ due to condensation are thus reduced.

FIG. 17 has shown a case where the evaporation through-holes 5E and the condensation through-holes 5C are respectively provided in the evaporation area E and the condensation area C. However, the present invention is not limited thereto, and the through-holes 5E or 5C may be provided in only one of the evaporation area E and the condensation area C. Even in such a case, the heat-transporting performance is improved as compared to the heat-transporting device 200 that does not include the through-holes 5.

Fourth Embodiment

Next, a fourth embodiment of the present invention will be described.

The above embodiments have described cases where the through-holes 5 are provided in the vapor-phase mesh member 21. In the fourth embodiment, however, through-holes 6 are provided in the liquid-phase mesh member 31. Therefore, that point will mainly be described.

Figure 18:
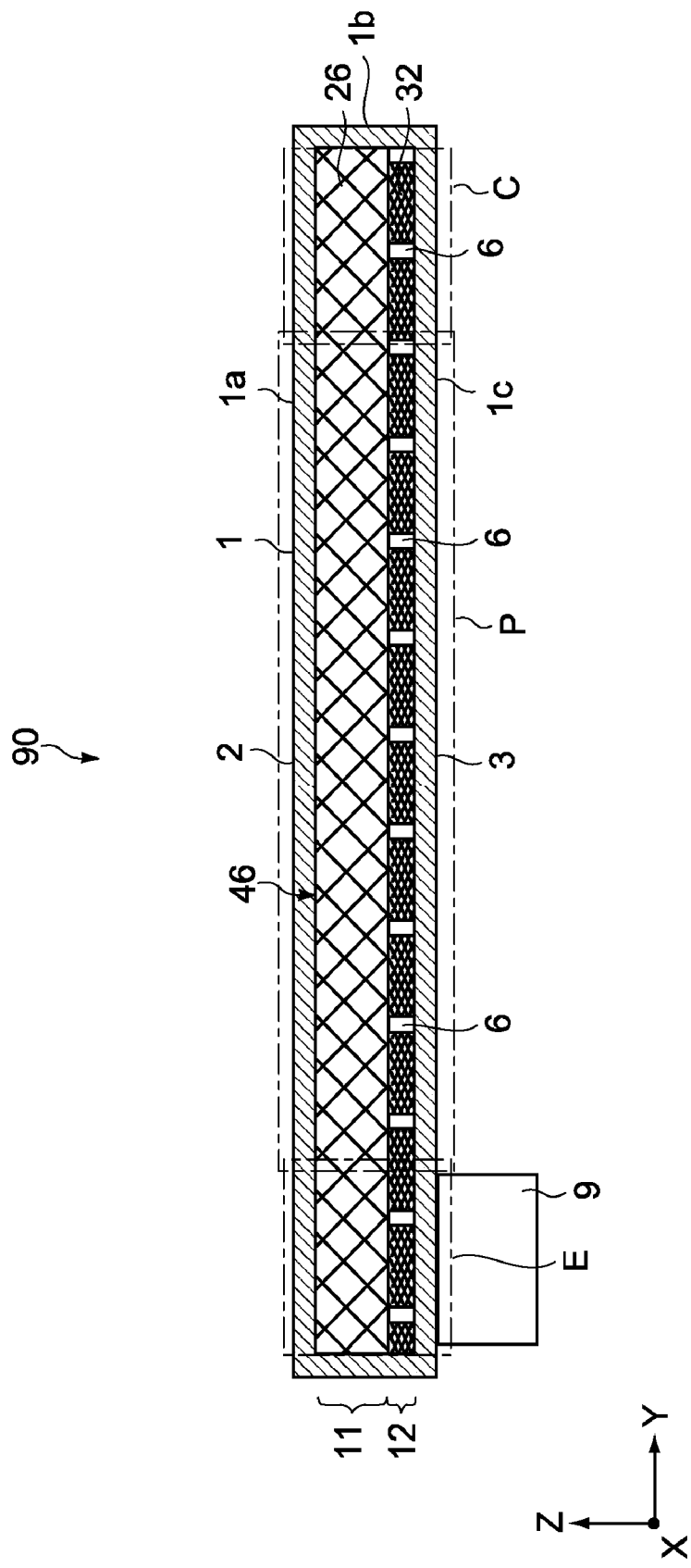
FIG. 18 is a cross-sectional side view of a heat-transporting device according to another embodiment of the present invention.

FIG. 18 is a cross-sectional side view of a heat-transporting device according to the fourth embodiment.

As shown in FIG. 18, a heat-transporting device 90 includes a laminated body 46 inside the vessel 1. The laminated body 46 includes a vapor-phase mesh member 26 that constitutes the vapor-phase flow path 11 and a liquid-phase mesh member 32 that constitutes the liquid-phase flow path 12.

The heat-transporting device 90 includes the evaporation area E at an end portion thereof on a side that is in contact with the heat source 9 and the condensation area C at the other end portion thereof. The heat-transporting device 90 also includes the flow-path area P that mainly functions as a flow path of a working fluid.

The liquid-phase mesh member 32 includes a plurality of through-holes 6 that are each larger than a mesh. In descriptions below, the through-holes 6 provided in the liquid-phase mesh member 32 will be referred to as liquid-phase through-holes 6 for convenience.

The plurality of liquid-phase through-holes 6 are formed in the y- and x-axis directions at predetermined intervals while penetrating the liquid-phase mesh member 32. The liquid-phase through-holes 6 are formed by, for example, press work or laser irradiation, though not limited thereto. In a case where the liquid-phase through-holes 6 are formed by press work, the liquid-phase through-holes 6 may be formed simultaneous with the cut-out of the liquid-phase mesh member 32 into an arbitrary size.

The liquid-phase through-holes 6 each have a diameter of about 0.5 mm to 2 mm, for example. However, the size of the liquid-phase through-holes 6 is not limited thereto and only needs to be set as appropriate in accordance with a size, mesh number, and the like of the liquid-phase mesh member 32.

The shape of the liquid-phase through-holes 6 is, for example, a circle. However, the shape is not limited thereto, and the liquid-phase through-holes 6 may take a shape of an oval, a polygon, or a star. Alternatively, at least two shapes out of a circle, an oval, a polygon, and a star may be combined.

By thus providing the liquid-phase through-holes 6 in the liquid-phase mesh member 32 as in the fourth embodiment, a flow-path resistance of the liquid-phase flow path 12 can be reduced. Accordingly, a maximum heat-transporting amount Qmax of the heat-transporting device 90 can be increased, with the result that heat-transporting performance of the heat-transporting device 90 can be improved.

Figure 19:
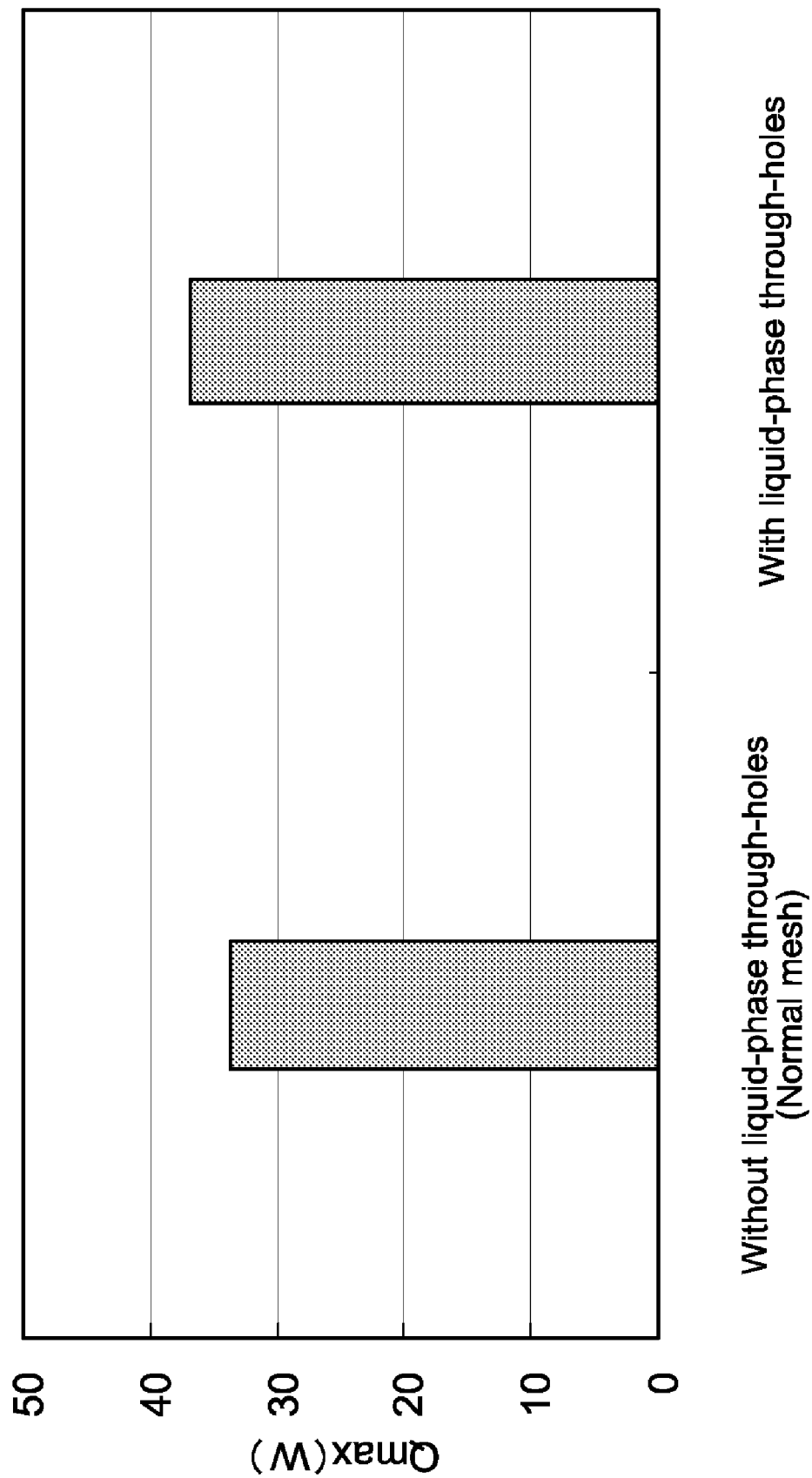
FIG. 19 is a diagram showing a maximum heat-transporting amount Qmax of a heat-transporting device that includes liquid-phase through-holes and a maximum heat-transporting amount Qmax of a heat-transporting device that does not include the liquid-phase through-holes.

FIG. 19 is a diagram showing a maximum heat-transporting amount Qmax of the heat-transporting device that includes the liquid-phase through-holes 6 and a maximum heat-transporting amount Qmax of a heat-transporting device that does not include the liquid-phase through-holes 6.

As shown in FIG. 19, it can be seen that the maximum heat-transporting amount Qmax of the heat-transporting device that includes the liquid-phase through-holes 6 is increased as compared to the maximum heat-transporting amount Qmax of the heat-transporting device that does not include the liquid-phase through-holes 6 (see FIG. 5). This is because, as described above, the flow-path resistance of the liquid-phase flow path 12 is reduced by the liquid-phase through-holes 6.

Modified Example

The fourth embodiment has been described assuming that the liquid-phase flow path 12 is constituted of one liquid-phase mesh member 32. However, the present invention is not limited thereto, and the liquid-phase flow path 12 may be formed by laminating two or more liquid-phase mesh members. In this case, the liquid-phase through-holes 6 may be provided in at least one of the plurality of liquid-phase mesh members.

The size of the liquid-phase through-holes 6 provided in the flow-path area P and the size of the liquid-phase through-holes 6 provided in the evaporation area E and the condensation area C may differ. In this case, the liquid-phase through-holes 6 provided in the flow-path area P may be formed to be larger than the liquid-phase through-holes 6 provided in the evaporation area E and the condensation area C. Alternatively, the liquid-phase through-holes 6 provided in the evaporation area E and the condensation area C may be formed to be larger than the liquid-phase through-holes 6 provided in the flow-path area P.

The liquid-phase through-holes 6 may gradually become smaller from the center of the heat-transporting device 90 toward the evaporation area E or the condensation area C. Alternatively, the liquid-phase through-holes 6 may gradually become larger from the center of the heat-transporting device 90 toward the evaporation area E or the condensation area C.

Alternatively, the liquid-phase through-holes 6 may be provided in only the flow-path area P and not the evaporation area E and/or the condensation area C. Alternatively, the liquid-phase through-holes 6 may be provided in only the evaporation area E and/or the condensation area C and not the flow-path area P.

The fourth embodiment has described a case where the vapor-phase flow path 11 is constituted of the vapor-phase mesh member 26. However, the present invention is not limited thereto, and the vapor-phase flow path 11 may be hollow. Alternatively, a plurality of columnar portions may be formed in the vapor-phase flow path 11 in place of the vapor-phase mesh member 26.

Since the flow-path resistance of the liquid-phase flow path 12 can also be reduced by the liquid-phase through-holes 6 in the modified example, heat-transporting performance can be improved as compared to the heat-transporting device 200 that does not include the liquid-phase through-holes 6 (see FIG. 5).

Fifth Embodiment

Next, a fifth embodiment of the present invention will be described.

The above embodiments have described cases where the through-holes are provided to the vapor-phase mesh member or the liquid-phase mesh member. In the fifth embodiment, however, the through-holes are provided to both the liquid-phase mesh member and the vapor-phase mesh member. Therefore, that point will mainly be described.

Figure 20:
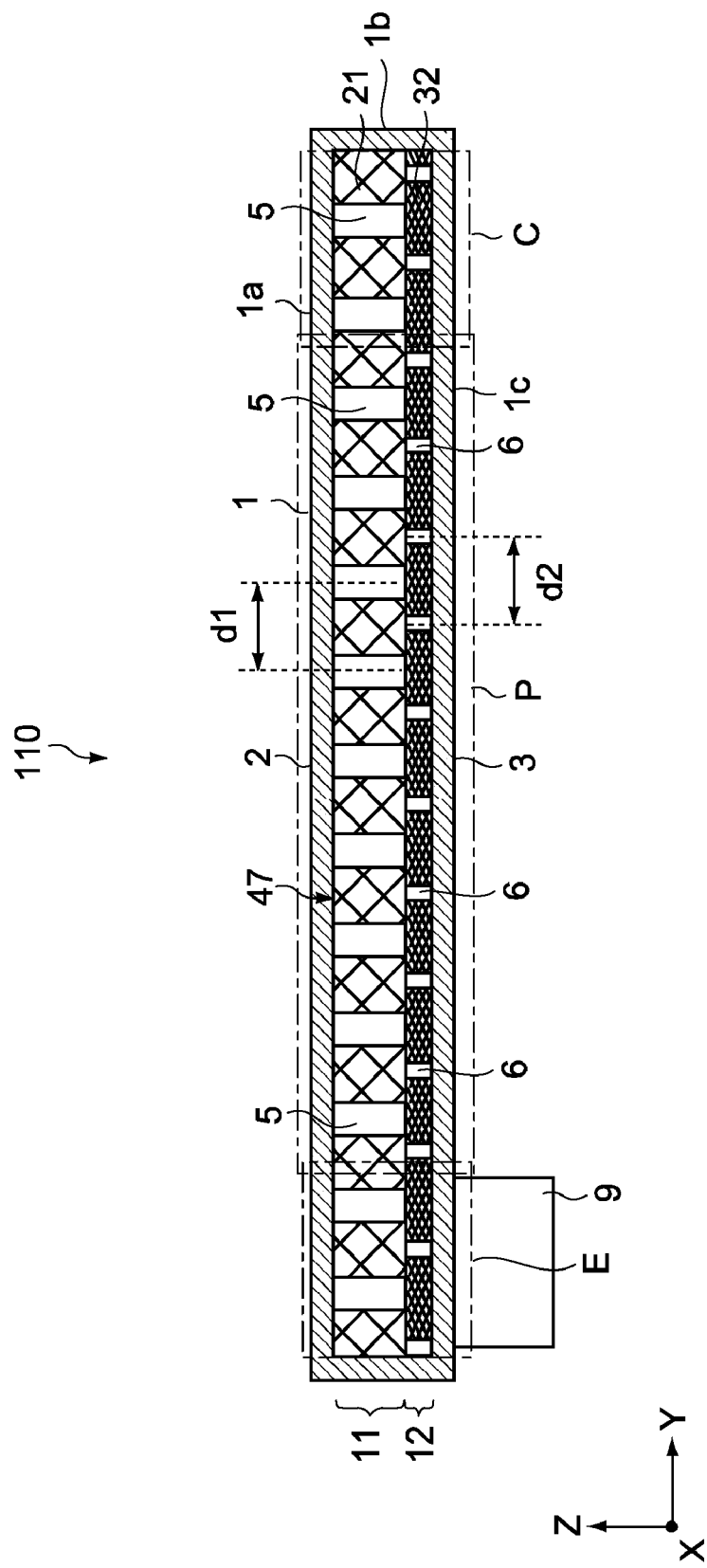
FIG. 20 is a cross-sectional side view of a heat-transporting device according to another embodiment of the present invention.

FIG. 20 is a cross-sectional side view of a heat-transporting device according to the fifth embodiment.

As shown in FIG. 20, a heat-transporting device 110 includes a laminated body 47 inside the vessel 1. The laminated body 47 includes the vapor-phase mesh member 21 that constitutes the vapor-phase flow path 11 and the liquid-phase mesh member 32 that constitutes the liquid-phase flow path 12.

The heat-transporting device 110 includes the evaporation area E at an end portion thereof on a side that is in contact with the heat source 9 and the condensation area C at the other end portion thereof. The heat-transporting device 110 also includes the flow-path area P that mainly functions as a flow path of a working fluid.

The vapor-phase mesh member 21 includes through-holes 5 that are each larger than a mesh. It should be noted that in descriptions below, the through-holes 5 provided in the vapor-phase mesh member 21 will be referred to as vapor-phase through-holes 5 for convenience. Similarly, the liquid-phase mesh member 32 includes liquid-phase through-holes 6 that are each larger than a mesh.

The liquid-phase through-holes 6 are arranged at positions relatively different from positions of the vapor-phase through-holes 5, for example. Alternatively, the liquid-phase through-holes 6 may be arranged at positions that are relatively the same as the positions of the vapor-phase through-holes 5.

An interval d1 between the adjacent vapor-phase through-holes 5 and an interval d2 between the adjacent liquid-phase through-holes 6 may either be the same or different. A relationship between the intervals d1 and d2 can be changed as appropriate.

Since both the vapor-phase through-holes 5 and the liquid-phase through-holes 6 are provided in the fifth embodiment, heat-transporting performance of the heat-transporting device 110 can be additionally improved. Specifically, since the substantial capillary radius rv of the vapor-phase flow path 11 is widened by the vapor-phase through-holes 5, the evaporation resistance, the flow-path resistance of the vapor-phase flow path 11, and the condensation resistance can be reduced. In addition, the flow-path resistance of the liquid-phase flow path can be reduced by the liquid-phase through-holes 6. Accordingly, a maximum heat-transporting amount Qmax of the heat-transporting device 110 can be additionally increased, with the result that the heat-transporting performance of the heat-transporting device 110 can be additionally improved.

Modified Example

The structures and modified examples of the vapor-phase flow path 11 described in the first to third embodiments above are all applicable to the vapor-phase flow path 11 of the fifth embodiment. Moreover, the structure and modified example of the liquid-phase flow path described in the fourth embodiment above are both applicable to the liquid-phase flow path 12 of the fifth embodiment.

For example, it is also possible for the vapor-phase flow path 11 to have a structure in which the vapor-phase through-holes 5 are provided in only the flow-path area P (flow-path through-holes 5P) and not the evaporation area E and the condensation area C (evaporation through-holes 5E and condensation through-holes 5C). Conversely, it is also possible for the vapor-phase through-holes 5 to be provided in only the evaporation area E and the condensation area C and not the flow-path area P.

Further, the liquid-phase flow path 12 may have a structure in which the liquid-phase through-holes 6 are provided in only the flow-path area P and not the evaporation area E and the condensation area C. Conversely, it is also possible for the liquid-phase through-holes 6 to be provided in only the evaporation area E and the condensation area C and not the flow-path area P.

Figure 21:
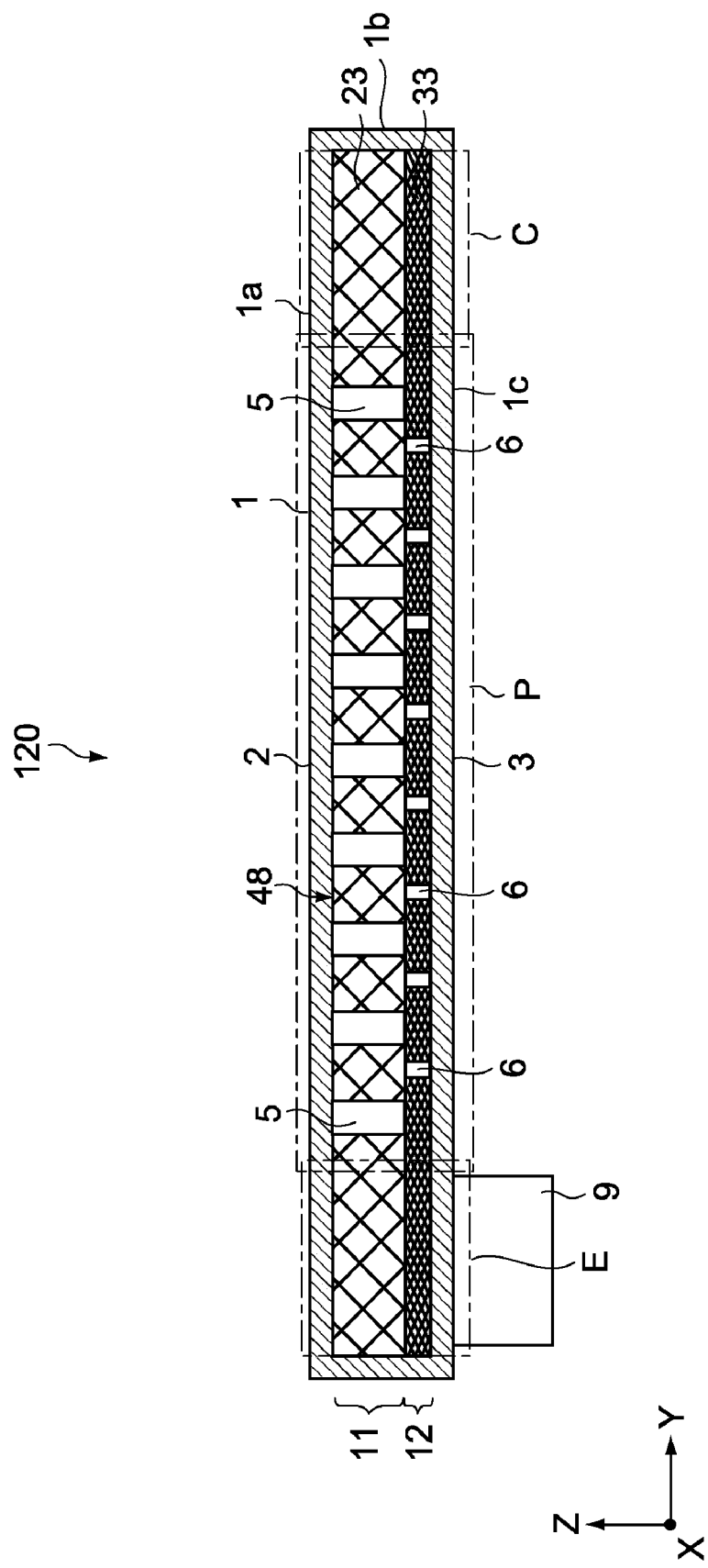
FIG. 21 is a diagram showing an example of a combination of a structure of the vapor-phase flow path and a structure of the liquid-phase flow path.
Figure 22:
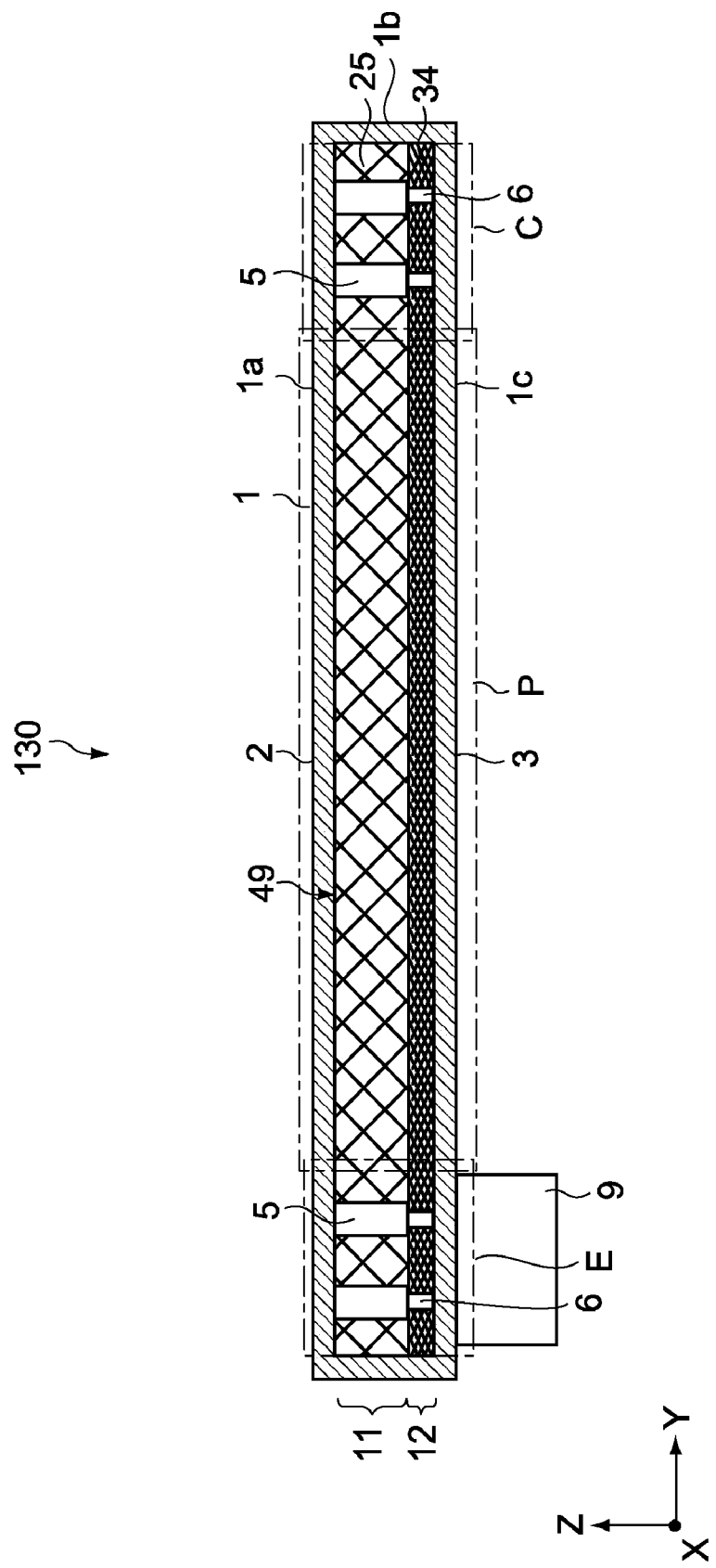
FIG. 22 is a diagram showing an example of a combination of a structure of the vapor-phase flow path and a structure of the liquid-phase flow path.

FIGS. 21 and 22 are diagrams each showing an example of a combination of structures of the vapor-phase flow path 11 and the liquid-phase flow path 12.

As shown in FIG. 21, a heat-transporting device 120 includes a laminated body 48 inside the vessel 1. The laminated body 48 includes a vapor-phase mesh member 23 that constitutes the vapor-phase flow path 11 and a liquid-phase mesh member 33 that constitutes the liquid-phase flow path 12. The vapor-phase mesh member 23 includes the vapor-phase through-holes 5 in the flow-path area P. Moreover, the liquid-phase mesh member 33 includes the liquid-phase through-holes 6 in the flow-path area P. It should be noted that the through-holes 5 and 6 are not provided in the evaporation area E and the condensation area C.

Also in the heat-transporting device 120, heat-transporting performance can be improved as compared to the heat-transporting device 200 that does not include the through-holes 5 and 6 (see FIG. 5). This is because the flow-path resistance of the vapor-phase flow path 11 is reduced by the vapor-phase through-holes 5 provided in the flow-path area P, and the flow-path resistance of the liquid-phase flow path 12 is reduced by the liquid-phase through-holes 6 provided in the flow-path area P.

As shown in FIG. 22, a heat-transporting device 130 includes a laminated body 49 inside the vessel 1. The laminated body 49 includes a vapor-phase mesh member 25 that constitutes the vapor-phase flow path 11 and a liquid-phase mesh member 34 that constitutes the liquid-phase flow path 12. The vapor-phase mesh member 25 includes the vapor-phase through-holes 5 in the evaporation area E and the condensation area C. Moreover, the liquid-phase mesh member 34 includes the liquid-phase through-holes 6 in the evaporation area E and the condensation area C. It should be noted that the through-holes 5 and 6 are not provided in the flow-path area P.

Figure 23:
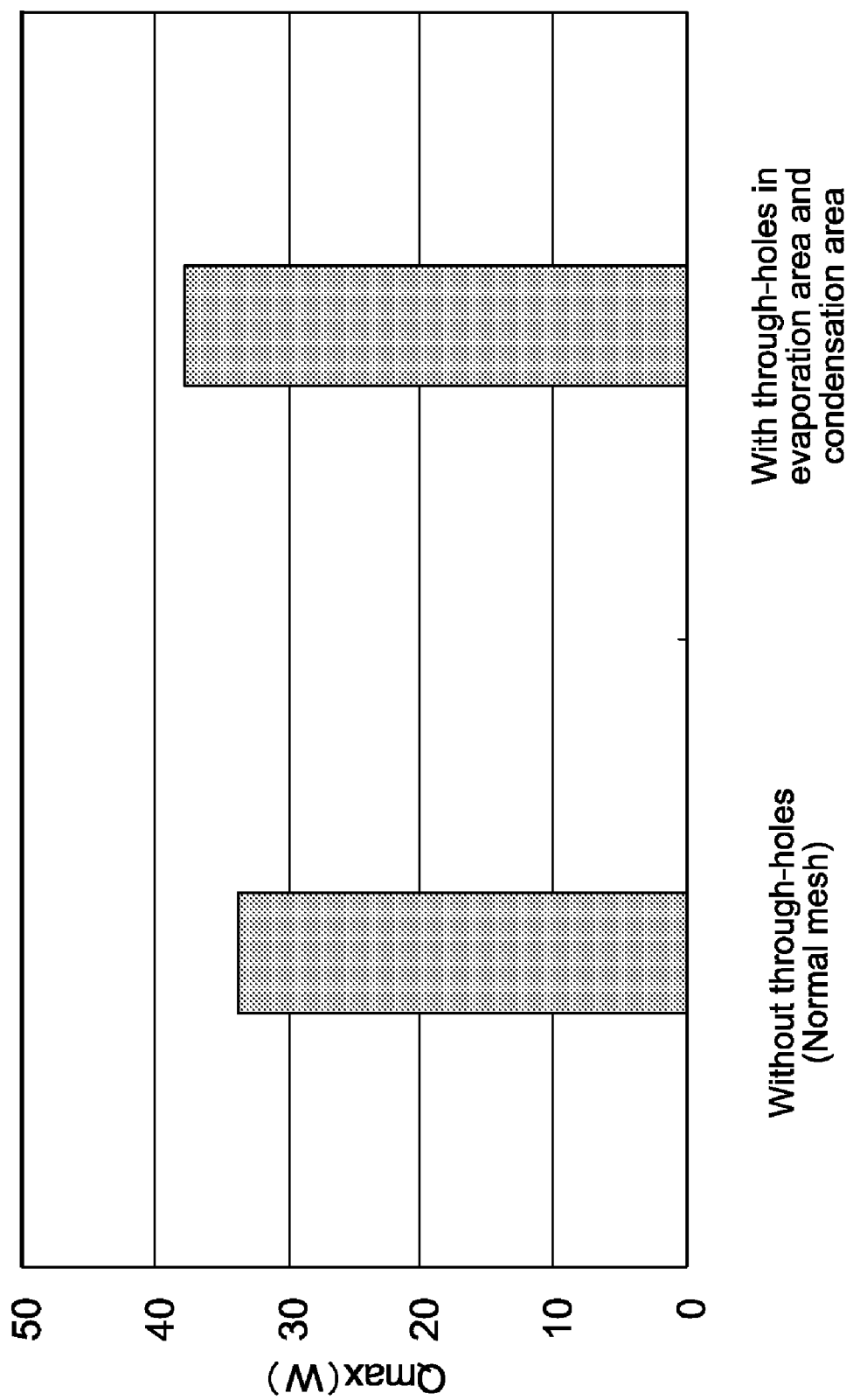
FIG. 23 is a diagram showing a maximum heat-transporting amount Qmax of the heat-transporting device shown in FIG. 22 and a maximum heat-transporting amount Qmax of the heat-transporting device that does not include the through-holes.

FIG. 23 is a diagram showing a maximum heat-transporting amount Qmax of the heat-transporting device 130 shown in FIG. 22 and a maximum heat-transporting amount Qmax of the heat-transporting device that does not include the through-holes.

As shown in FIG. 23, it can be seen that also in a structure in which both the vapor-phase through-holes 5 and the liquid-phase through-holes 6 are provided in the evaporation area E and the condensation area C, heat-transporting performance is improved as compared to the heat-transporting device 200 that does not include the through-holes 5 and 6 (see FIG. 5). The reason why such a result is obtained is because the boiling resistance is reduced by the vapor-phase through-holes 5 and the liquid-phase through-holes 6 provided in the evaporation area E and the condensation resistance is reduced by the vapor-phase through-holes 5 and the liquid-phase through-holes 6 provided in the condensation area C.

Sixth Embodiment

Next, a sixth embodiment of the present invention will be described.

The above embodiments have been described assuming that the vessel 1 is constituted of two plate members 2 and 3. In the sixth embodiment, however, the vessel is formed by bending a single plate member. Therefore, that point will mainly be described.

Figure 25:
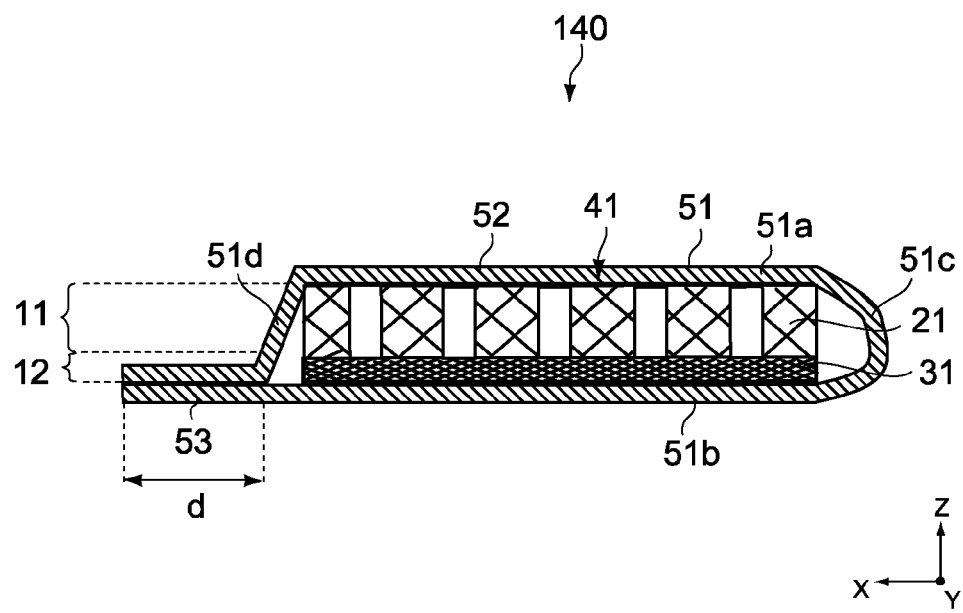
FIG. 25 is a cross-sectional diagram taken along the line A-A of FIG. 24.
Figure 26:
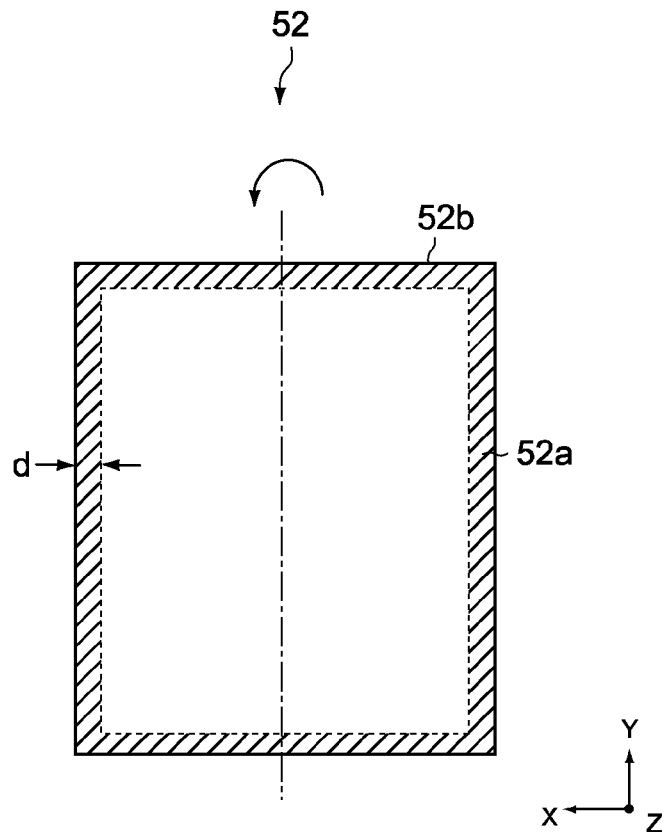
FIG. 26 is a development view of a plate member that constitutes a vessel of the heat-transporting device according to the embodiment.

FIG. 24 is a perspective view of a heat-transporting device according to the sixth embodiment. FIG. 25 is a cross-sectional diagram taken along the line A-A of FIG. 24. FIG. 26 is a development view of a plate member that constitutes a vessel of the heat-transporting device.

As shown in FIG. 24, a heat-transporting device 140 includes a thin rectangular plate-like vessel 51 that is elongated in one direction (y-axis direction). The vessel 51 is formed by bending a single plate member 52.

Typically, the plate member 52 is constituted of oxygen-free copper, tough pitch copper, or a copper alloy. However, the present invention is not limited thereto, and the plate member 52 may be constituted of metal other than copper, or other materials having a high heat conductivity may be used instead.

As shown in FIGS. 24 and 25, a side portion 51c of the vessel 51 in a direction along a longitudinal direction (y-axis direction) is curved. In other words, since the vessel 51 is formed by bending substantially the center of the plate member 52 shown in FIG. 26, the side portion 51c is curved. In descriptions below, the side portion 51c may be referred to as curved portion 51c.

The vessel 51 includes bonding portions 53 at a side portion 51d on the other side of the side portion 51c (curved portion 51c) and side portions 51e and 51f along a short-side direction. The bonding portions 53 protrude from the side portions 51d, 51e, and 51f. At the bonding portions 53, the bent plate member 52 is bonded. The bonding portions 53 correspond to a bonding area 52a of the plate member 52 shown in FIG. 26 (area indicated by slashes in FIG. 26). The bonding area 52a is an area within a predetermined distance d from an edge portion 52b of the plate member 52.

Examples of the method of bonding the bonding portions 53 (bonding area 52a) include a diffusion bonding method, an ultrasonic bonding method, a brazing method, and a welding method, but the bonding method is not particularly limited.

The laminated body 41 is disposed inside the vessel 51 of the heat-transporting device 140. The laminated body 41 is formed by laminating the vapor-phase mesh member 21 including the vapor-phase through-holes 5 and the liquid-phase mesh member 31. The vapor-phase mesh member 21 constitutes the vapor-phase flow path 11, and the liquid-phase mesh member 31 constitutes the liquid-phase flow path 12.

It should be noted that the structures of the vapor-phase flow path 11 and the liquid-phase flow path 12 are not limited to those shown in FIG. 25. For example, the through-holes 6 may be provided in the liquid-phase mesh member 31, or the sizes of the through-holes 5 and 6 provided in the flow-path area P may differ from those of the through-holes 5 and 6 provided in the evaporation area E and the condensation area C. All the structures of the vapor-phase flow path 11 and the liquid-phase flow path 12 described in the above embodiments are applicable to the sixth embodiment. The same holds true for embodiments to be described later.

Method of Producing Heat-Transporting Device

Next, a method of producing a heat-transporting device 140 will be described.

FIG. 27 are diagrams showing the method of producing a heat-transporting device.

Figure 27A:
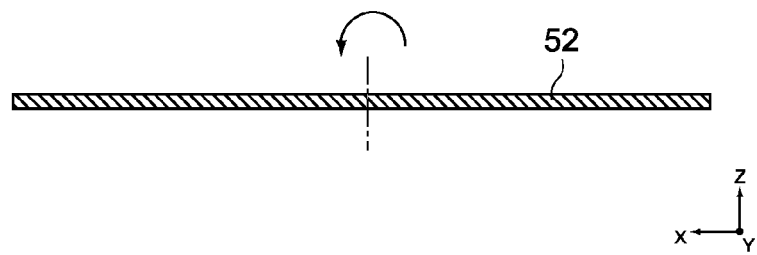
FIG. 27 are diagrams showing a method of producing the heat-transporting device according to the embodiment.

As shown in FIG. 27A, the plate member 52 is prepared first. Then, the plate member 52 is bent at substantially the center thereof.

Figure 27B:
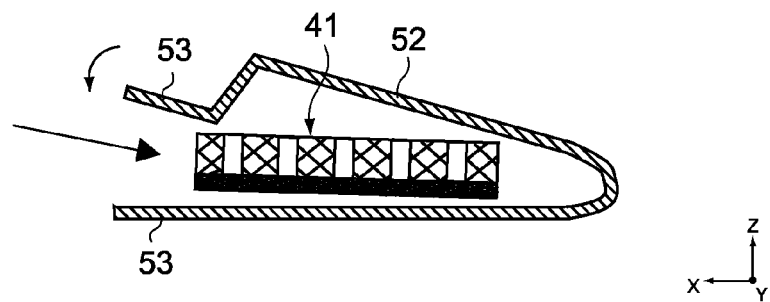

After the plate member 52 is bent to a predetermined angle, the laminated body 41 is inserted between the bent plate member 52 as shown in FIG. 27B. It should be noted that it is also possible to set the laminated body 41 at a predetermined position on the plate member 52 before the plate member 52 is bent.

Figure 27C:
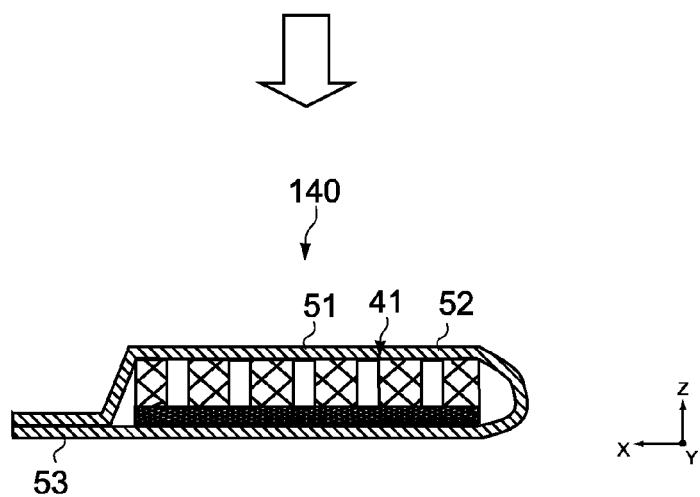

After the laminated body 41 is inserted between the bent plate member 52, the plate member 52 is bent further so as to enclose the laminated body 41 inside as shown in FIG. 27C. Then, the bonding portions 53 (bonding area 52a) of the bent plate member 52 are bonded. As the method of bonding the bonding portions 53, a diffusion bonding method, an ultrasonic bonding method, a brazing method, a welding method, and the like are used as described above.

Since the vessel 51 is constituted of a single plate member 52 in the heat-transporting device 140 according to the sixth embodiment, costs can be reduced. Further, although, when the vessel is constituted of two or more members, those members need to be aligned in position, alignment of positions of the members is not necessary in the heat-transporting device 140 of the sixth embodiment. Therefore, the heat-transporting device 140 can be produced with ease. It should be noted that although a structure in which the plate member 52 is bent with an axis along the longitudinal direction (y-axis direction) is shown, it is also possible for the plate member 52 to be bent with an axis along the short-side direction (x-axis direction).

Modified Example

Next, a modified example of the heat-transporting device according to the sixth embodiment will be described.

Figure 28:
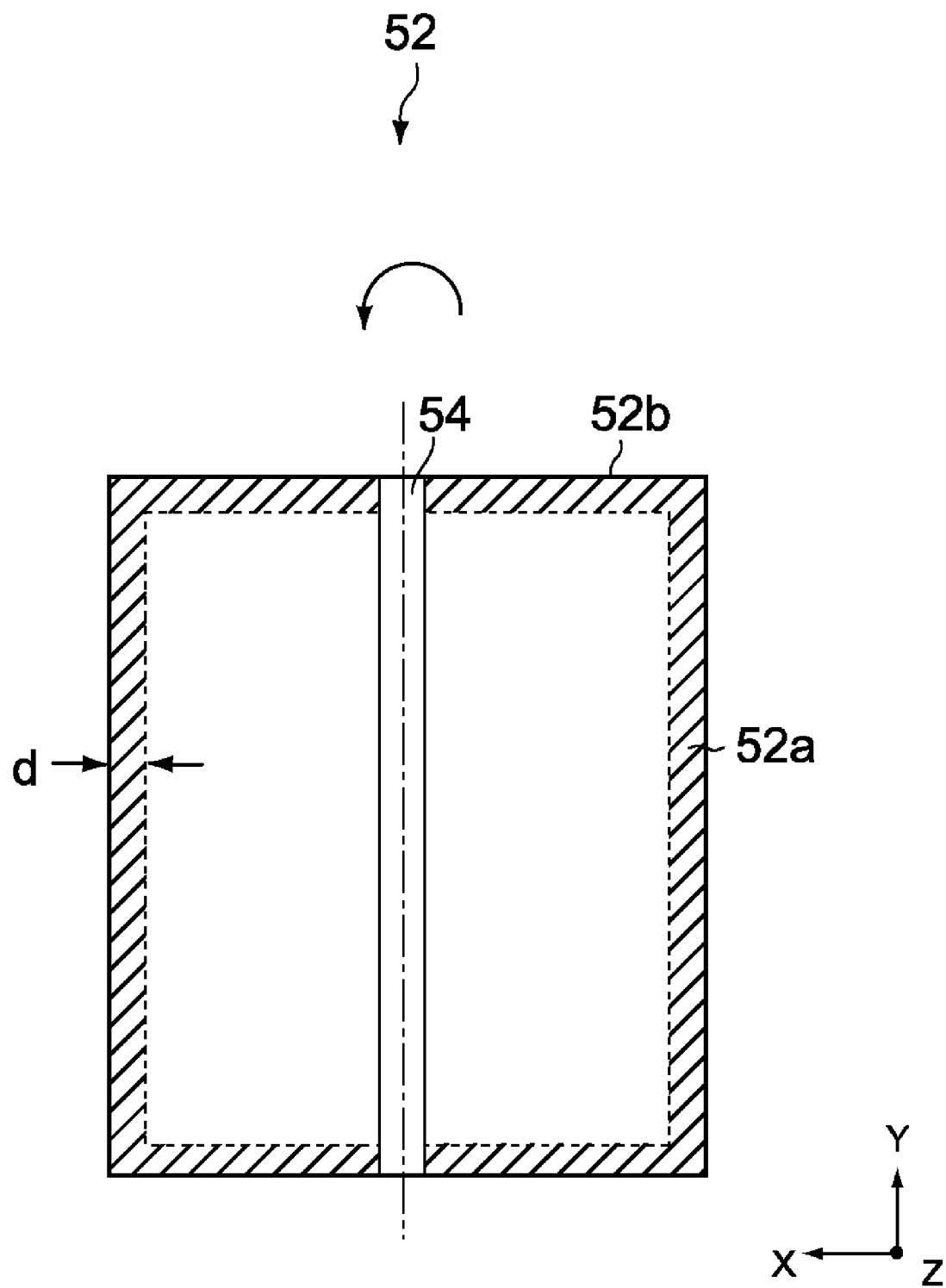
FIG. 28 is a development view of a plate member for explaining a heat-transporting device according to a modified example.

FIG. 28 is a development view of the plate member for explaining the modified example.

As shown in FIG. 28, the plate member 52 includes a groove 54 at a center thereof along a longitudinal direction (y-axis direction). The groove 54 is formed by, for example, press work or etching, but the method of forming the groove 54 is not particularly limited.

By providing the groove 54 on the plate member 52, the plate member 52 can be bent easily. As a result, it becomes easier to produce the heat-transporting device 140.

Seventh Embodiment

Next, a seventh embodiment of the present invention will be described. It should be noted that in the seventh embodiment, points different from those of the sixth embodiment above will mainly be described.

Figure 29:
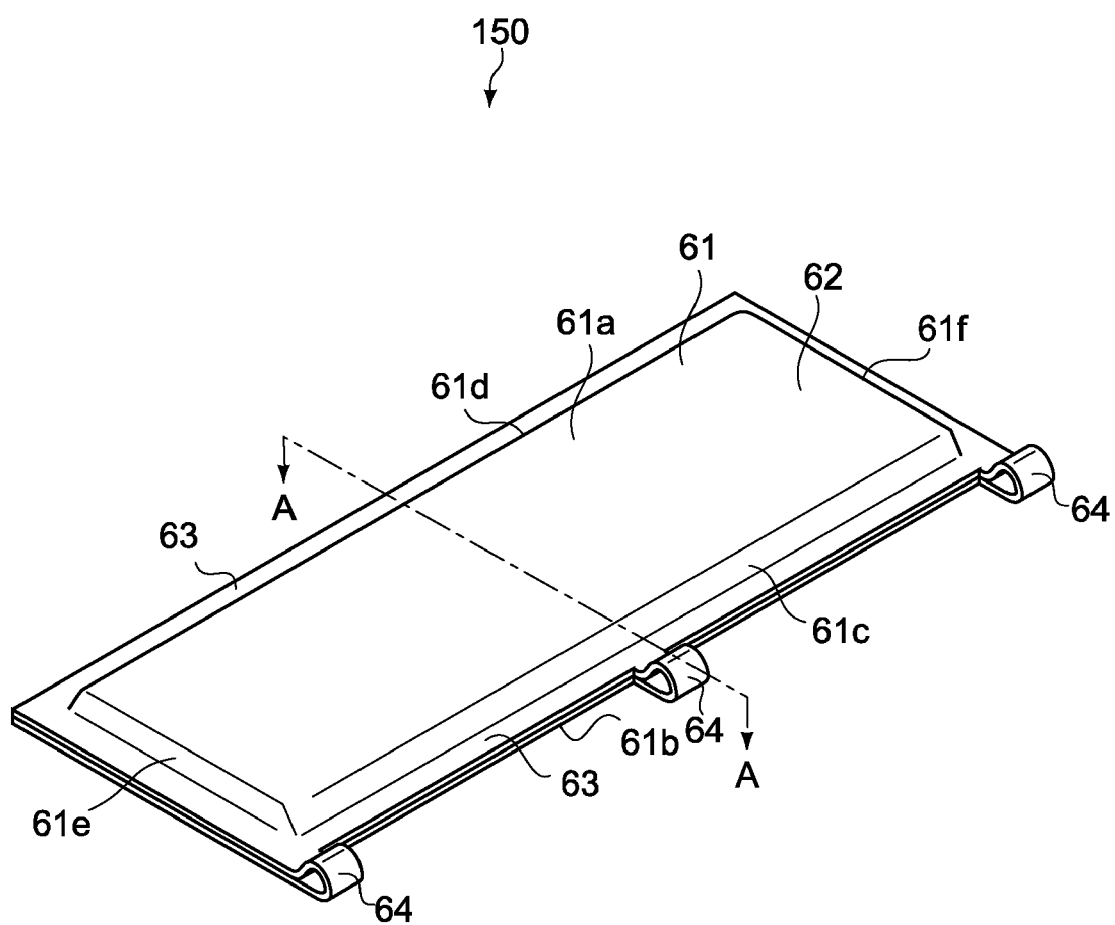
FIG. 29 is a perspective view of a heat-transporting device according to another embodiment of the present invention.
Figure 30:
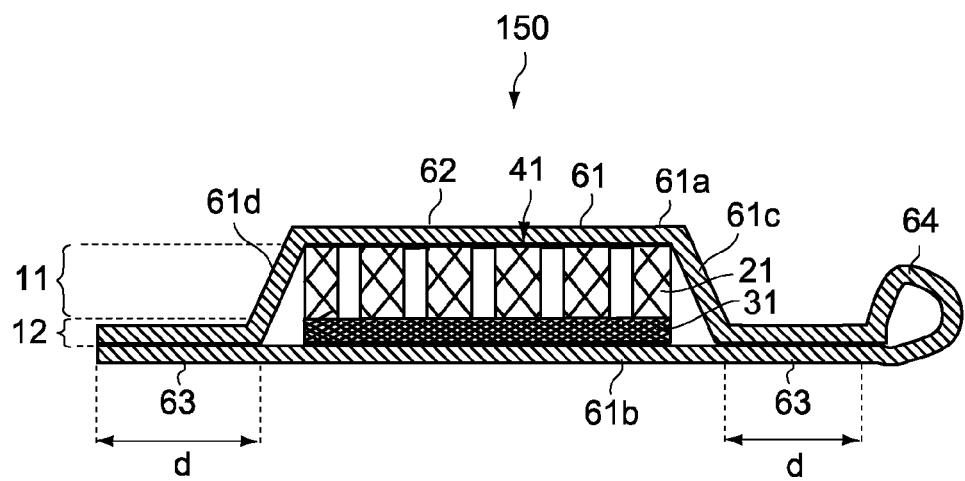
FIG. 30 is a cross-sectional diagram taken along the line A-A of FIG. 29.
Figure 31:
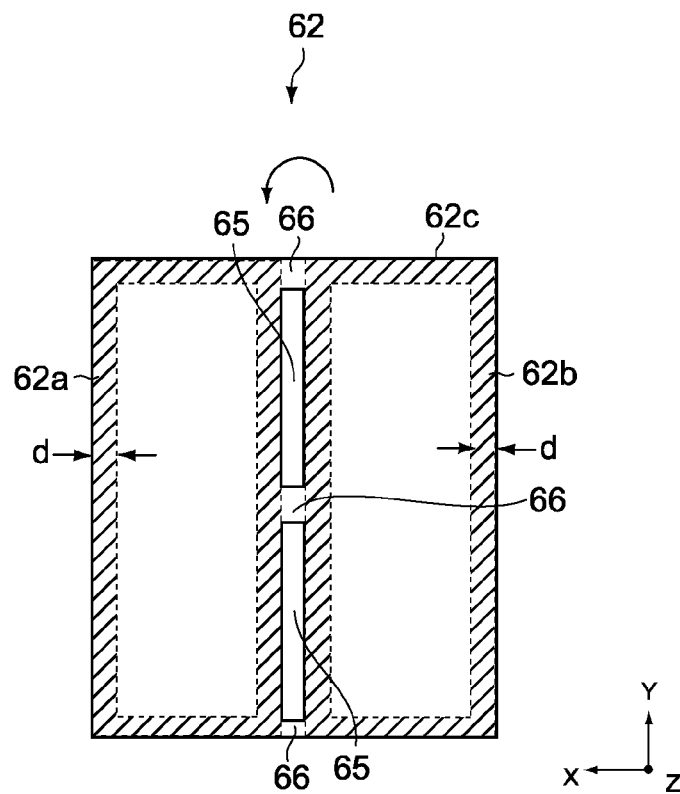
FIG. 31 is a development view of a plate member that constitutes a vessel of the heat-transporting device according to the embodiment.

FIG. 29 is a perspective view of a heat-transporting device according to the seventh embodiment. FIG. 30 is a cross-sectional diagram taken along the line A-A of FIG. 29. FIG. 31 is a development view of a plate member that constitutes a vessel of the heat-transporting device.

As shown in FIGS. 29 and 30, a heat-transporting device 150 includes a thin rectangular plate-like vessel 61 that is elongated in one direction (y-axis direction).

The vessel 61 is formed by bending a plate member 62 shown in FIG. 31 at a center thereof. The plate member 62 is provided with two openings 65 near the center along a longitudinal direction thereof.

The vessel 61 includes bonding portions 63 at side portions 61c and 61d in a direction along the longitudinal direction (y-axis direction) and side portions 61e and 61f in a direction along a short-side direction (x-axis direction). The vessel 61 is formed by bonding the bonding portions 63. The bonding portions 63 correspond to bonding areas 62a and 62b of the plate member 62 shown in FIG. 31 (area indicated by slashes in FIG. 31). The bonding areas 62a and 62b are arranged axisymmetrically on left- and right-hand sides of the plate member 62. The bonding areas 62a and 62b are areas within a predetermined distance d from an edge portion 62c or the openings 65 of the plate member 62.

The bonding portion 63 provided at the side portion 61c of the vessel 61 includes three protrusions 64. The three protrusions 64 are bent. The three protrusions 64 correspond to areas 66 each between the opening 65 and the edge portion 62c and an area 66 between the two openings 65 on the plate member 62 shown in FIG. 31.

Since the openings 65 are formed on the plate member 62 in the heat-transporting device 150 of the seventh embodiment, the plate member 62 can be bent with ease. As a result, it becomes easier to produce the heat-transporting device 150.

It is also possible to form a groove in the areas 66 each between the opening 65 and the edge portion 62c and the area 66 between the two openings 65 by press work, for example. Accordingly, the plate member 62 can be bent more easily. It should be noted that although a structure in which the plate member 62 is bent with an axis along the longitudinal direction (y-axis direction) is shown, it is also possible for the plate member 62 to be bent with an axis along the short-side direction (x-axis direction).

Electronic Apparatus

Next, an electronic apparatus including the heat-transporting device 10 (or 50 to 150; the same holds true for descriptions below) described in the corresponding embodiment above will be described. This embodiment exemplifies a laptop PC as the electronic apparatus.

Figure 32:
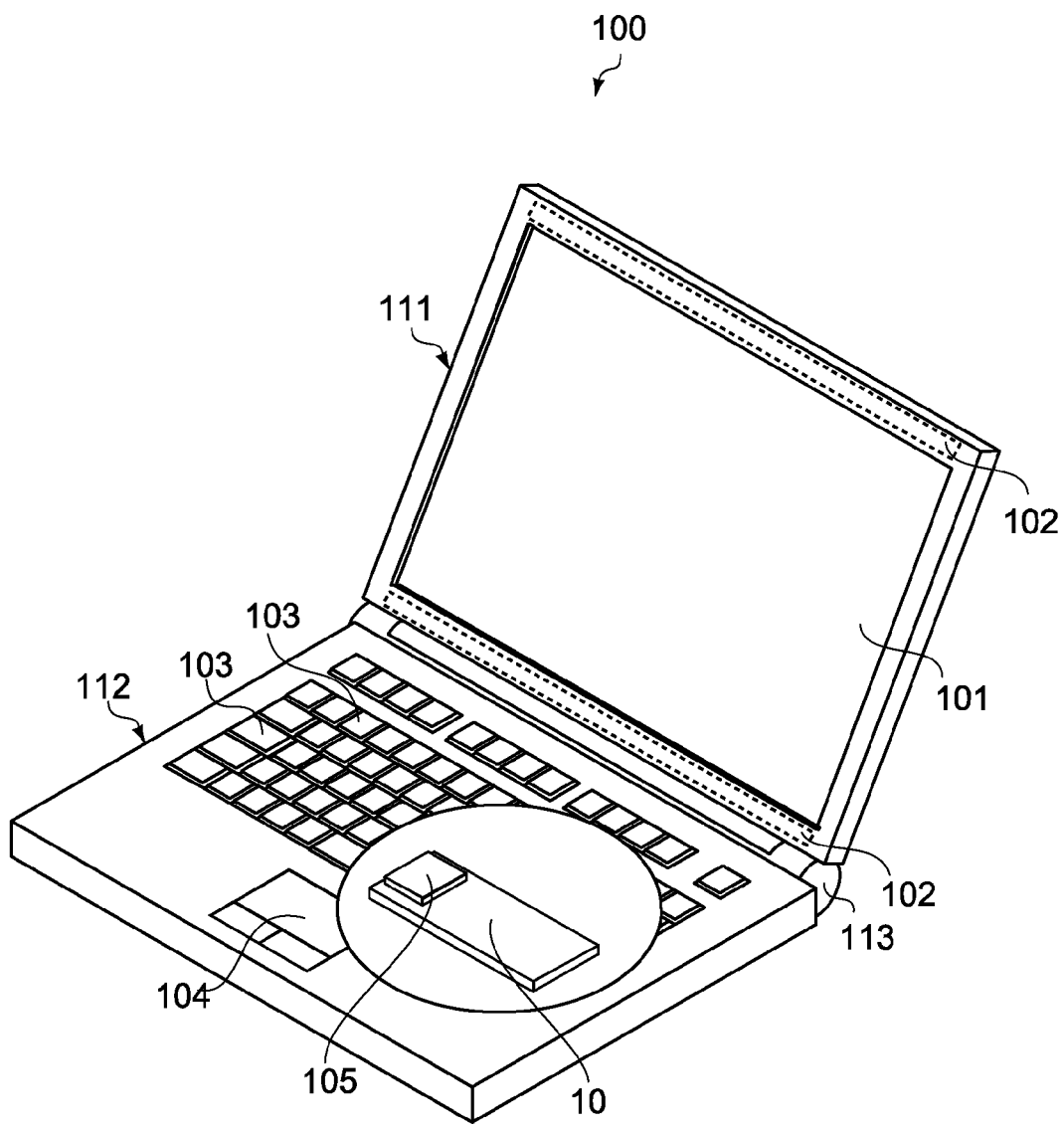
FIG. 32 is a perspective view of a laptop PC.

FIG. 32 is a perspective view of a laptop PC 100. As shown in FIG. 32, the laptop PC 100 includes a first casing 111, a second casing 112, and a hinge portion 113 that rotatably supports the first casing 111 and the second casing 112.

The first casing 111 includes a display portion 101 and edge-light-type backlights 102 that irradiate light onto the display portion 101. The backlights 102 are respectively provided on upper and lower sides inside the first casing 111. The backlights 102 are each formed by arranging a plurality of white-color LEDs (Light-emitting Diodes) on a copper plate, for example.

The second casing 112 includes a plurality of input keys 103 and a touchpad 104. The second casing 112 also includes a built-in control circuit board (not shown) on which electronic circuit components such as a CPU 105 are mounted.

Inside the second casing 112, the heat-transporting device 10 is set so as to come into contact with the CPU 105. In FIG. 32, a plane of the heat-transporting device 10 is illustrated to be smaller than that of the second casing 112. However, the heat-transporting device 10 may have an equivalent plane size as the second casing 112.

Alternatively, the heat-transporting device 10 may be set inside the first casing 111 while being in contact with the copper plates constituting the backlights 102. In this case, the heat-transporting device 10 is provided plurally in the first casing 111.

As described above, due to high heat-transporting performance, the heat-transporting device 10 can readily transport heat generated in the CPU 105 or the backlights 102. Accordingly, heat can be readily radiated outside the laptop PC 100. Moreover, since an internal temperature of the first casing 111 or the second casing 112 can be made uniform by the heat-transporting device 10, low-temperature burn can be prevented.

Furthermore, since high heat-transporting performance is realized in a thin heat-transporting device 10, thinning of the laptop PC 100 can also be realized.

FIG. 32 has exemplified the laptop PC as the electronic apparatus. However, the electronic apparatus is not limited thereto, and other examples of the electronic apparatus include audiovisual equipment, a display apparatus, a projector, game equipment, car navigation equipment, robot equipment, a PDA (Personal Digital Assistance), an electronic dictionary, a camera, a cellular phone, and other electrical appliances.

The heat-transporting device and electronic apparatus described heretofore are not limited to the above embodiments, and various modifications are possible.

Figure 33:
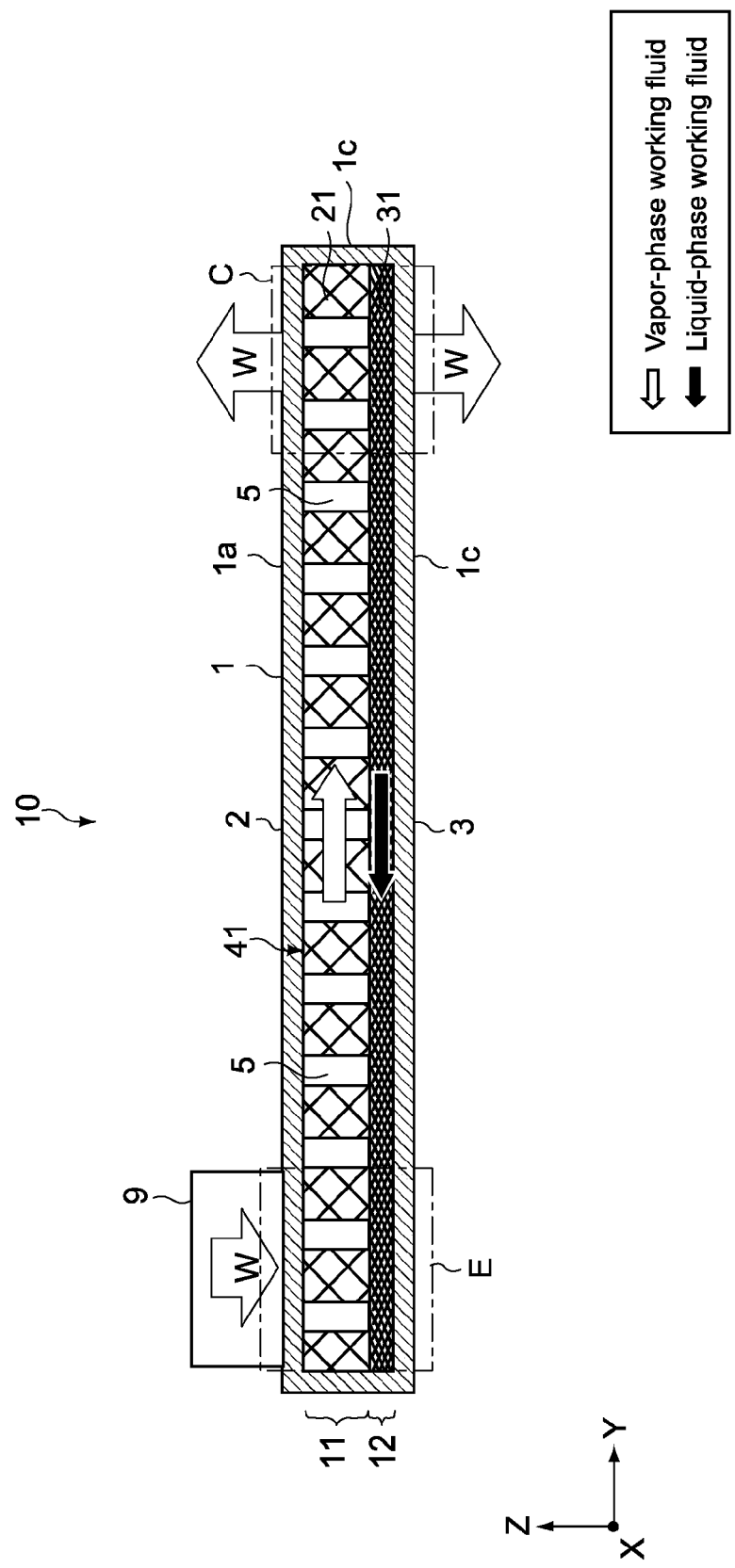
FIG. 33 is a diagram showing a heat-transporting device in which a heat source is disposed on a vapor-phase flow path side.

FIGS. 9, 14, and the like have shown the structures in which the heat source 9 such as a CPU is provided on the lower portion 1c side of the heat-transporting device 10 (or 50, 60, etc.; the same holds true for descriptions below). However, the present invention is not limited thereto, and the heat source 9 such as a CPU may be provided while being in contact with the upper portion 1a side of the heat-transporting device 10. In other words, since the heat-transporting device 10 is formed like a thin plate, high heat-transporting performance can be exerted irrespective of a position at which the heat source 9 comes into contact with the heat-transporting device 10. It should be noted that for reference, the heat-transporting device 10 in which the heat source 9 is disposed on the vapor-phase flow path 11 side is shown in FIG. 33.

The above embodiments have described cases where the liquid-phase flow path 12 is constituted of a mesh member. However, the present invention is not limited thereto, and a part of the liquid-phase flow path 12 may be formed of a material other than the mesh member. Examples of the material other than the mesh member include felt, a metal form, a thin line, a sintered body, and a microchannel including fine grooves.

The present application contains subject matter related to that disclosed in Japanese Priority Patent Application JP 2008-328872 filed in the Japan Patent Office on Dec. 24, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A heat-transporting device, comprising:
 a working fluid to transport heat using a phase change;
 a vessel to seal in the working fluid;
 a vapor-phase flow path that includes a first mesh member and causes the working fluid in a vapor phase to circulate inside the vessel, the first mesh member including at least one through-hole of a first size that is larger than a mesh size of the first mesh member;
 a liquid-phase flow path to cause the working fluid in a liquid phase to circulate inside the vessel;
 an evaporation area where the working fluid evaporates;
 a condensation area where the working fluid is condensed; and
 a flow-path area through which the working fluid circulates,
 wherein the at least one through-hole of the first size is disposed in the flow-path area and is not disposed in the evaporation and condensation areas.

2. The heat-transporting device according to claim 1, wherein the liquid-phase flow path includes a second mesh member including at least one through-hole larger than a mesh size of the second mesh member.

3. The heat-transporting device according to claim 2, wherein the through-hole of the second mesh member is provided in the flow-path area.

4. The heat-transporting device according to claim 2, wherein the through-hole of the first mesh member is formed at a position different from that of the through-hole of the second mesh member.

5. The heat-transporting device according to claim 1, wherein the vessel is plate-like.

6. The heat-transporting device according to claim 5, wherein the vessel is formed by bending a plate member so that the first mesh member is sandwiched by the bent plate member.

7. The heat-transporting device according to claim 6, wherein the plate member includes an opening in an area where the plate member is bent.

8. A heat-transporting device, comprising:
a working fluid to transport heat using a phase change;
a vessel to seal in the working fluid;
a vapor-phase flow path that includes a first mesh member and causes the working fluid in a vapor phase to circulate inside the vessel, the first mesh member including a through-hole larger than a mesh size of a first mesh member;
a liquid-phase flow path to cause the working fluid in a liquid phase to circulate inside the vessel;
an evaporation area where the working fluid evaporates;
a condensation area where the working fluid is condensed; and
a flow-path area through which the working fluid circulates,
wherein the first mesh member includes a first through-hole having a first area and a second through-hole having a second area different from the first area, the first through-hole being provided in the flow-path area, the second through-hole being provided in at least one of the evaporation area and the condensation area.

9. The heat-transporting device according to claim 8, wherein the first area is larger than the second area.

10. The heat-transporting device according to claim 8, wherein the first area is smaller than the second area.

11. An electronic apparatus, comprising:
a heat source; and
a heat-transporting device including
a working fluid to transport heat of the heat source using a phase change,
a vessel to seal in the working fluid,
a vapor-phase flow path that includes a first mesh member and causes the working fluid in a vapor phase to circulate inside the vessel, the first mesh member including at least one through-hole larger than a mesh size of the first mesh member,
a liquid-phase flow path to cause the working fluid in a liquid phase to circulate inside the vessel,
an evaporation area where the working fluid evaporates;
a condensation area where the working fluid is condensed; and
a flow-path area through which the working fluid circulates,
wherein the first mesh member includes a first through-hole having a first area and a second through-hole having a second area different from the first area, the first through-hole being provided in the flow-path area, the second through-hole being provided in at least one of the evaporation area and the condensation area.

* * * * *